(12) United States Patent
Case

(10) Patent No.: US 6,610,991 B1
(45) Date of Patent: Aug. 26, 2003

(54) ELECTRONICS ASSEMBLY APPARATUS WITH STEREO VISION LINESCAN SENSOR

(75) Inventor: Steven K. Case, St. Louis Park, MN (US)

(73) Assignee: CyberOptics Corporation, Eden Prairie, MN (US)

( * ) Notice: Subject to any disclaimer, the term of this patent is extended or adjusted under 35 U.S.C. 154(b) by 0 days.

(21) Appl. No.: 09/434,325

(22) Filed: Nov. 4, 1999

Related U.S. Application Data

(60) Provisional application No. 60/144,614, filed on Jul. 20, 1999, provisional application No. 60/144,616, filed on Jul. 20, 1999, provisional application No. 60/131,996, filed on Apr. 30, 1999, provisional application No. 60/107,505, filed on Nov. 6, 1998, and provisional application No. 60/107,188, filed on Nov. 5, 1998.

(51) Int. Cl.[7] .............................................. G01B 11/24
(52) U.S. Cl. .................. 250/559.19; 348/133; 356/625; 250/559.22
(58) Field of Search ....................... 250/559.19, 559.22, 250/559.27; 356/614, 625, 628, 629, 630; 382/154; 348/133, 134

(56) References Cited

U.S. PATENT DOCUMENTS

| | | | |
|---|---|---|---|
| 4,473,842 A | 9/1984 | Suzuki et al. ............... | 358/107 |
| 4,521,112 A | 6/1985 | Kuwabara et al. .......... | 356/375 |
| 4,578,810 A | 3/1986 | MacFarlane et al. .......... | 382/8 |
| 4,615,093 A | 10/1986 | Tews et al. .................. | 29/407 |
| 4,675,993 A | 6/1987 | Harada ........................ | 29/740 |
| 4,700,398 A | 10/1987 | Mizuno et al. ................ | 382/1 |
| 4,706,379 A | 11/1987 | Seno et al. ................... | 29/740 |
| 4,727,471 A | 2/1988 | Driels et al. ................ | 364/167 |
| 4,738,025 A | 4/1988 | Arnold ........................ | 29/834 |
| 4,743,768 A | 5/1988 | Watannabe .................. | 250/556 |
| 4,772,125 A | 9/1988 | Yoshimura et al. .......... | 356/237 |
| 4,782,273 A | 11/1988 | Moynagh ..................... | 318/568 |
| 4,794,689 A | 1/1989 | Seno et al. .................... | 29/740 |
| 4,811,410 A | 3/1989 | Amir et al. .................... | 382/8 |
| 4,875,778 A | 10/1989 | Luebbe et al. .............. | 356/394 |

(List continued on next page.)

FOREIGN PATENT DOCUMENTS

| | | |
|---|---|---|
| DE | 198 26 555 A1 | 12/1999 |
| EP | 664 666 A1 | 1/1994 |
| EP | 0 942 641 A2 | 9/1997 |
| EP | 0 854 671 A1 | 7/1998 |
| EP | 0 730 397 B1 | 4/1999 |
| JP | 2-18900 | 7/1990 |
| JP | 2-275700 | 11/1990 |
| JP | 2-306700 | 12/1990 |
| JP | 3-030499 | 2/1991 |
| JP | 3-110898 | 5/1991 |

(List continued on next page.)

OTHER PUBLICATIONS

Copy of International Search Report from Application No. PCT/US01/11629 with international filing date of Apr. 4, 2001.
Copy of International Search Report from Application No. PCT/US01/07810 with international filing date of Mar. 13, 2001.
"A New Sense for Depth of Field," by A. Pentland, IEEE Trans. Pattern Anal. Machine Intell. 9, pp. 523–531 (1987).

(List continued on next page.)

*Primary Examiner*—Stephone Allen
(74) *Attorney, Agent, or Firm*—Westman, Champlin & Kelly, P.A.

(57) ABSTRACT

An electronics assembly apparatus, and its imaging system are disclosed. The imaging system, which can include a linescan sensor, measures the height of an object on a component as well as the coplanarity of object features by viewing the object features from a plurality of view angles.

56 Claims, 20 Drawing Sheets

U.S. PATENT DOCUMENTS

| | | | | |
|---|---|---|---|---|
| 4,876,728 | A | 10/1989 | Roth | 382/21 |
| 4,920,429 | A | 4/1990 | Jaffe et al. | 358/471 |
| 4,942,618 | A | 7/1990 | Sumi et al. | 382/8 |
| 4,959,898 | A | 10/1990 | Landman et al. | 29/705 |
| 4,969,108 | A | 11/1990 | Webb et al. | 364/513 |
| 4,973,216 | A | 11/1990 | Domm | 414/744.5 |
| 4,980,971 | A | 1/1991 | Bartschat et al. | 29/833 |
| 5,030,008 | A | 7/1991 | Scott et al. | 356/394 |
| 5,046,113 | A | 9/1991 | Hoki | 382/8 |
| 5,084,959 | A | 2/1992 | Ando et al. | 29/740 |
| 5,084,962 | A | 2/1992 | Takahashi et al. | 29/833 |
| 5,086,559 | A | 2/1992 | Akatsuchi | 29/834 |
| 5,096,353 | A | 3/1992 | Tesh et al. | 414/225 |
| 5,099,522 | A | 3/1992 | Morimoto | 382/8 |
| 5,140,643 | A | 8/1992 | Izumi et al. | 382/8 |
| 5,148,591 | A | 9/1992 | Pryor | 29/407 |
| 5,195,234 | A | 3/1993 | Pine et al. | 29/720 |
| 5,208,463 | A | 5/1993 | Honma et al. | 250/561 |
| 5,233,745 | A | 8/1993 | Morita | 29/705 |
| 5,237,622 | A | 8/1993 | Howell | 382/8 |
| 5,249,239 | A | 9/1993 | Kida | 382/8 |
| 5,249,349 | A | 10/1993 | Kuinose et al. | 29/721 |
| 5,278,634 | A | 1/1994 | Skunes et al. | 356/375 |
| 5,309,522 | A | 5/1994 | Dye | 382/41 |
| 5,342,460 | A | 8/1994 | Hidese | 156/64 |
| 5,369,492 | A | 11/1994 | Sugawara | 356/394 |
| 5,377,405 | A | 1/1995 | Sakurai et al. | 29/833 |
| 5,379,514 | A | 1/1995 | Okuda et al. | 29/833 |
| 5,383,270 | A | 1/1995 | Iwatsuka et al. | 29/840 |
| 5,403,140 | A | 4/1995 | Carmichael et al. | 414/280 |
| 5,434,629 | A | 7/1995 | Pearson et al. | 348/721 |
| 5,452,370 | A | 9/1995 | Nagata | 382/153 |
| 5,456,003 | A | 10/1995 | Yamamoto et al. | 29/840 |
| 5,461,480 | A | 10/1995 | Yamada et al. | 356/394 |
| 5,491,888 | A | 2/1996 | Sakurai et al. | 29/832 |
| 5,523,663 | A | 6/1996 | Tsuge et al. | 318/568.16 |
| 5,541,834 | A | 7/1996 | Tomigashi et al. | 364/167.01 |
| 5,555,090 | A | 9/1996 | Schumtz | 356/381 |
| 5,559,727 | A | 9/1996 | Deley et al. | 364/559 |
| 5,560,100 | A | 10/1996 | Englert | 29/833 |
| 5,566,447 | A | 10/1996 | Sakurai | 295/832 |
| 5,592,563 | A | 1/1997 | Zahavi | 382/154 |
| 5,608,642 | A | 3/1997 | Onodera | 364/478.01 |
| 5,619,328 | A | 4/1997 | Sakurai | 356/375 |
| 5,660,519 | A | 8/1997 | Ohta et al. | 414/783 |
| 5,661,561 | A | 8/1997 | Wurz et al. | 356/386 |
| 5,671,527 | A | 9/1997 | Asai et al. | 29/740 |
| 5,694,219 | A | 12/1997 | Kim | 356/375 |
| 5,724,722 | A | 3/1998 | Hashimoto | 29/740 |
| 5,743,005 | A | 4/1998 | Nakao et al. | 29/833 |
| 5,768,759 | A | 6/1998 | Hudson | 29/407.04 |
| 5,777,746 | A | 7/1998 | Dlugos | 356/380 |
| 5,787,577 | A | 8/1998 | Kent | 29/833 |
| 5,832,107 | A | 11/1998 | Choate | 382/154 |
| 5,839,186 | A | 11/1998 | Onodera | 29/720 |
| 5,855,059 | A | 1/1999 | Togami et al. | 29/740 |
| 5,864,944 | A | 2/1999 | Kashiwagi et al. | 29/833 |
| 5,878,484 | A | 3/1999 | Araya et al. | 29/740 |
| 5,999,206 | A | 12/1999 | Takahashi et al. | 356/376 |
| 5,999,266 | A | 12/1999 | Takahashi et al. | 356/376 |
| 5,999,640 | A | 12/1999 | Hatase et al. | 382/151 |
| 6,018,865 | A | 2/2000 | Michael | 29/740 |
| 6,031,242 | A | 2/2000 | Hudson | 250/548 |
| 6,118,538 | A | 9/2000 | Haugan et al. | 356/375 |
| 6,195,165 | B1 | 2/2001 | Sayegh | 356/376 |
| 6,232,724 | B1 | 5/2001 | Onimoto et al. | 315/161 |
| 6,243,164 | B1 | 6/2001 | Baldwin et al. | 356/375 |
| 6,291,816 | B1 | 9/2001 | Liu | 250/234 |
| 6,342,916 | B1 | 1/2002 | Kashiwagi et al. | 348/87 |

FOREIGN PATENT DOCUMENTS

| | | |
|---|---|---|
| JP | 3-265198 | 11/1991 |
| JP | 3-117898 | 12/1991 |
| JP | 3-289197 | 12/1991 |
| JP | HEI 3-293800 | 12/1991 |
| JP | 3-104300 | 2/1992 |
| JP | 4-051598 | 2/1992 |
| JP | 4-064292 | 2/1992 |
| JP | 4-083400 | 3/1992 |
| JP | 4-107988 | 4/1992 |
| JP | 4-107993 | 4/1992 |
| JP | 4-262201 | 9/1992 |
| JP | 4-271200 | 9/1992 |
| JP | 4-311100 | 11/1992 |
| JP | 5-053360 | 7/1993 |
| JP | 5-335793 | 12/1993 |
| JP | 7-020960 | 8/1994 |
| JP | 6-291490 | 10/1994 |
| JP | 6-310899 | 11/1994 |
| JP | HEI 7-336099 | 12/1995 |
| JP | 8-005335 | 1/1996 |
| JP | 8-018289 | 1/1996 |
| JP | 8-032299 | 2/1996 |
| JP | 8-043025 | 2/1996 |
| JP | 8-046396 | 2/1996 |
| JP | 8-167799 | 6/1996 |
| JP | 2554424 | 8/1996 |
| JP | 2554437 | 8/1996 |
| JP | 9-023097 | 1/1997 |
| JP | 9-246799 | 9/1997 |
| JP | 9-293998 | 11/1997 |
| JP | 9-307286 | 11/1997 |
| JP | 9-307297 | 11/1997 |
| JP | 2847801 B2 | 1/1999 |
| JP | 2000-312100 | 7/2000 |
| JP | 2000-299600 | 10/2000 |
| JP | P3186387 | 7/2001 |
| WO | WO 99/42257 | 8/1999 |
| WO | WO 00/26611 | 5/2000 |

OTHER PUBLICATIONS

"A Matrix Based Method for Determining Depth From Focus," by J. Ens and P. Lawrence, in Proceedings of IEEE Conference on Computer Vision and Pattern Recognition (Institute of Electrical and Electronics Engineers, New Your, pp. 600–609 (1991).

"A Perspective on Range Finding Technique for Compute Vision," by R.A. Jarvis, IEEE Trans. Pattern Anal. Machine Intell. 5, pp. 122–139 (1983).

"Pyramid Based Depth from Focus," by T. Darrel and K. Wohn, in Proceedings of IEEE Conference on Computer Vision and Pattern Recognition (Institute of Electrical and Electronics Engineers, New York), pp. 504–509 (1988).

"Library of C/C++ Machine Vision Software Routines", *Imaging Technology*, pp. 63–68 (1999).

"Application of Modulation Measurement Profilometry to Objects with Surface Holes", by Likun et al., *Applied Optics*, vol. 38, No. 7, pp. 1153–1158, Mar. 1999.

"Real Time Computation of Depth from Defocus", by Watanabe et al., *SPIE*, vol. 2599, pp. 14–25 (1996).

"Root–Mean Square Error in Passive Autofocusing and 3D Shape Recovery", by Subbarao et al., *SPIE*, vol. 2909, pp. 162–177 (1997).

"A Stereo Imaging System for Dimensional Measurement", by Robert C. Chang, SPIE, vol. 2909, pp. 50–57 (1997).

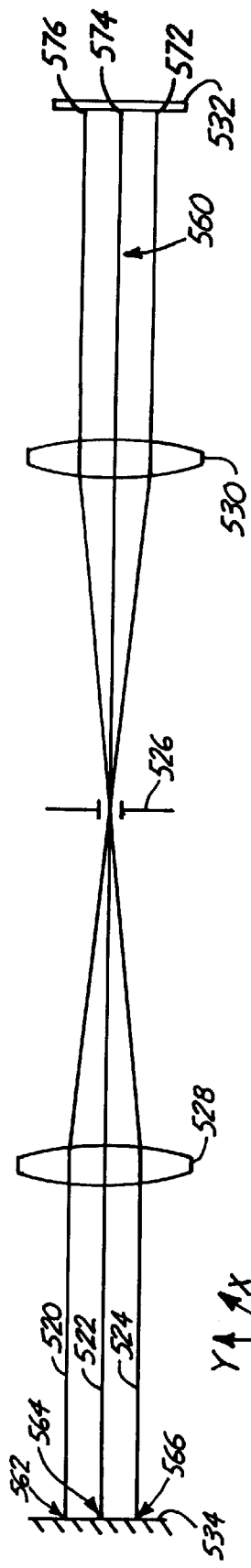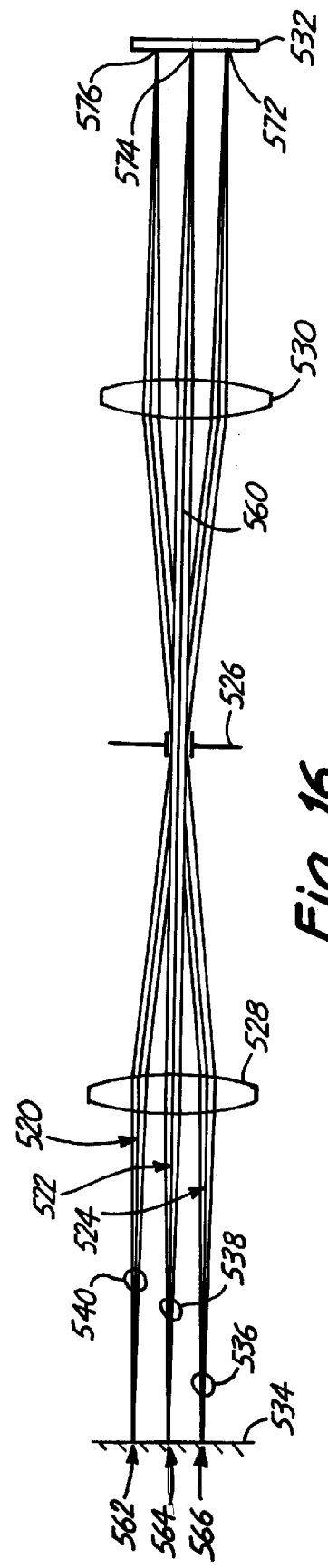
Fig. 15
Fig. 16

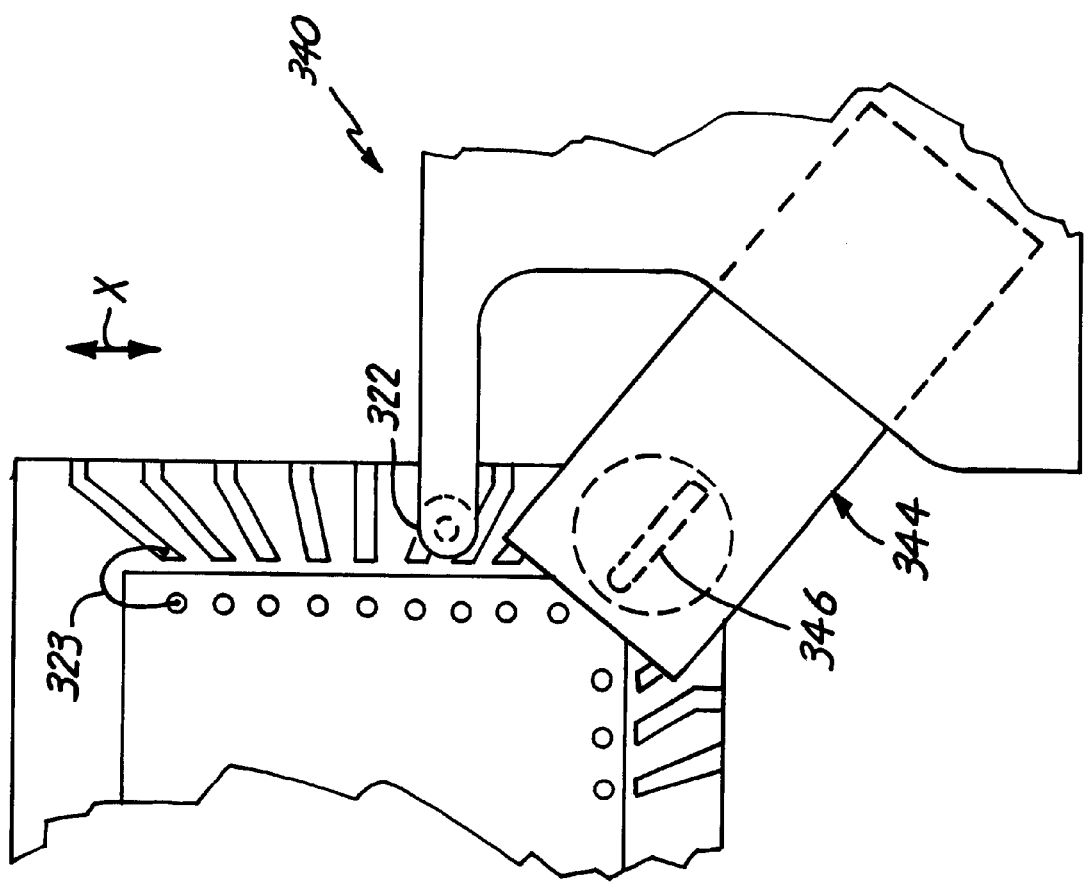

ELECTRONICS ASSEMBLY APPARATUS WITH STEREO VISION LINESCAN SENSOR

CROSS-REFERENCE TO RELATED APPLICATIONS

This application claims the priority of earlier filed co-pending Provisional Applications; Ser. No. 60/107,188, filed Nov. 5, 1998, entitled COMPACT SCANNING CAMERA; Ser. No. 60/107,505 filed Nov. 6, 1998, entitled COMPACT SCANNING CAMERA; Ser. No. 60/131,996, filed Apr. 30, 1999, entitled COMPACT LINE SCAN CAMERA WITH IMPROVED THROUGHPUT; Ser. No. 60/144,616, filed Jul. 20, 1999, entitled SINGLE PATH LINESCAN CAMERA FOR SENSING HEIGHT THROUGH DEFOCUSING; and Ser. No. 60/144,614, filed Jul. 20, 1999, entitled STEREO VISION LINESCAN CAMERA WITH COPLANARITY AND RELATED APPLICATIONS THEREOF. Each and every provisional application listed above is incorporated by reference herein in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF INVENTION

The present invention relates to imaging systems for electronic components, such as those used in pick and place machines, and more particularly to imaging systems which image a portion of a component onto a linear detector line by line, and are able to provide information about the height of a feature on the component.

BACKGROUND OF THE INVENTION

Prior art systems for detecting height and coplanarity can be divided into two separate groups; those which are based on a linear detector and those which are not (e.g., vision based and large array detectors systems). Vision based and large array detector systems are typically not "on-head" systems. In on-head sensing systems, a sensor senses the orientation and condition (e.g., coplanar, absence/presence of features, etc.) of the component while the component is transported to the printed circuit board. On-head systems are preferred over other systems because they provide exceptional efficiency in placing the component, leading to a high throughput in the electronic assembly operation. On the other hand, off-head systems have a sensor which senses the orientation and condition of a component with a fixed inspection system. Vision based and large array detector systems have a fairly large weight and size, so as to limit the scanning speed for the sensor in an "on-head" application.

Linescan sensor systems are characterized by having a linear detector and are adapted to scan a portion of a component. Associated electronics assemble multiple scans of a portion of a component and provide a composite image of the area of interest on a component. However, existing linescan systems are typically off-head which slows down the process of placing the component. Furthermore, many are based on the principle of triangulation (the use of structured light to compute a height), which requires complex optics and registration in the sensor.

The prior art lacks a versatile, compact linescan sensor system reporting coplanarity, component quality and orientation of the object, which system is adapted for use either in "on-head" or "off-head" applications. The ideal system would allow for inspection of features on different types of complex components at high throughput, and be easily adapted for use with pick and place machines, wire bonders and screen printers.

SUMMARY OF THE INVENTION

An imaging system is disclosed which provides orientation information as well as height information about the object. The imaging system includes a linescan sensor, which views the object from at least two views and outputs a set of partial images of the object for each view. Once the at least two sets of partial images are combined into an assembled image, electronics compute the height of object features from the at least two assembled images. The height information is particularly useful to assess the quality of a feature on an electronic component, such as a ball, grid, lead, or column. Orientation information about the object can be computed from one or more of the assembled images. Once the height of at least four features on the object is computed, a measure of the coplanarity of the component may be computed. Additionally, the height information from the present invention may be used to assess the quality of an object, such as ascertaining the absence or presence of critical features on the object.

The method and apparatus of the present invention is useful for both single and multi-nozzle pick and place machines, but may also be used with screen printers to assess whether applied solder bricks are present or absent, or to assess whether the height of the solder bricks is appropriate. Optionally, the method and apparatus of the present invention is useful with wire bonders, to ascertain the height of a bonded wire or the like as a measure of the quality of the bonding process.

BRIEF DESCRIPTION OF THE DRAWINGS

FIG. 15 is a diagrammatic view of a telecentric imaging system.

FIG. 16 is a diagrammatic view of a telecentric imaging system imaging multiple ray bundles.

FIG. 27 is a top plan view of a wire bonder in accordance with an embodiment of the present invention.

DETAILED DESCRIPTION OF THE PREFERRED EMBODIMENTS

The method and apparatus of the present invention is best understood by first disclosing a preferred linescan sensor for use with the present invention. After a complete discussion of the preferred embodiments of this preferred linescan sensor, the theory and embodiments of the present height sensing linescan sensor will be detailed. It is understood that the method of the present invention may be practiced with other types of linescan sensors or any sensor having a linear detector which builds up an image of an object line by line.

Figure 1:
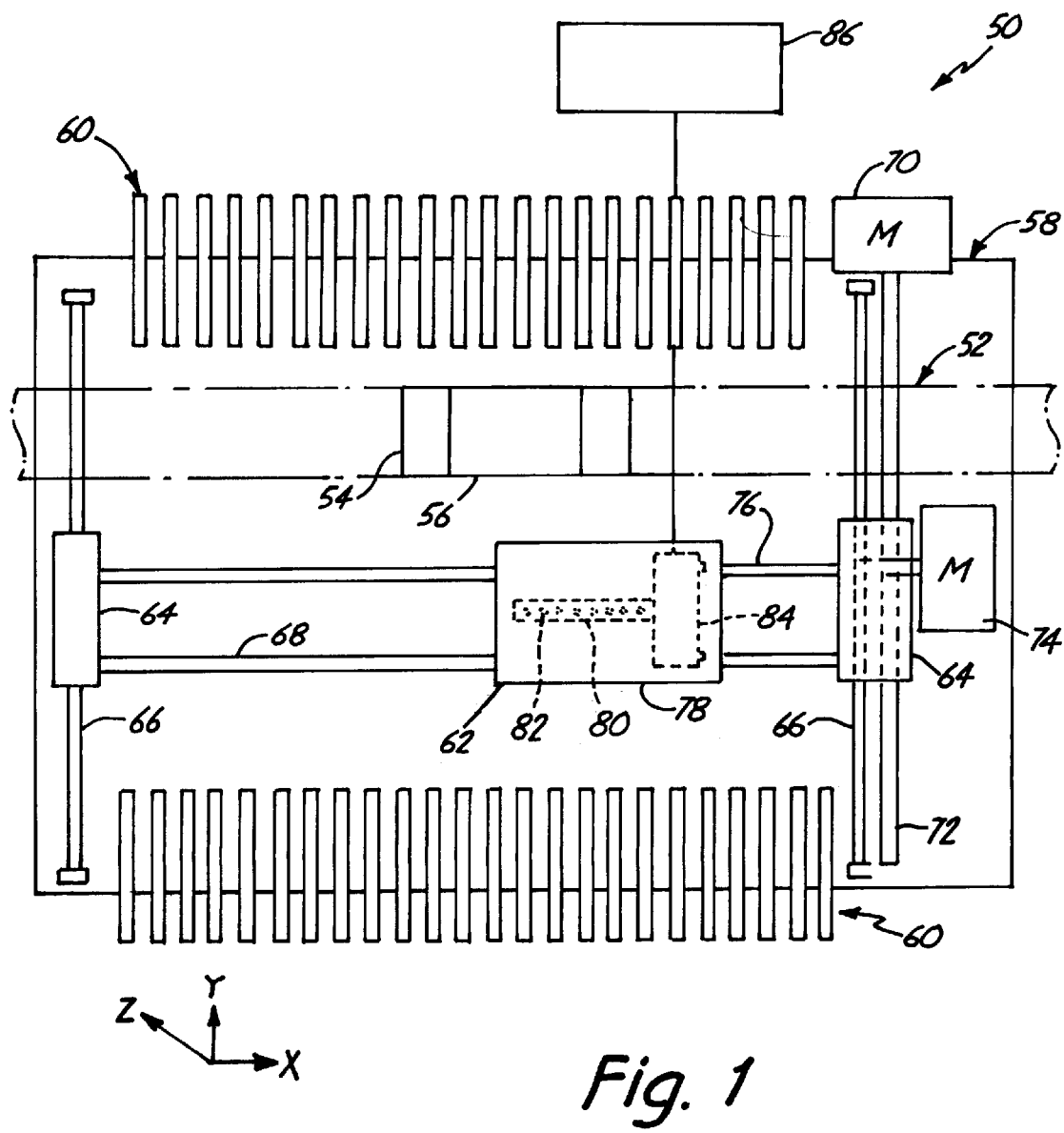
FIG. 1 is a top plan view of a pick and place machine.

FIG. 1 is a top plan view of pick and place machine 50 in accordance with an embodiment of the invention. Although much of the present invention will be described with respect to pick and place machine 50, other forms of pick and place machines, such as a split gantry design, are useful with embodiments of the present invention. Additionally, although embodiments of the present invention will be described with respect to pick and place machines, some embodiments of the present invention include an imaging system provided with a wire bonder or screen printer, as will be described with respect to FIGS. 19 and 21. As shown in FIG. 1, machine 50 includes transport mechanism 52 that is adapted to transport a workpiece such as a printed circuit board. Transport mechanism 52 includes mounting section 54 and conveyor 56. Transport mechanism 52 is disposed on base 58 such that a workpiece is carried to mounting section 54 by conveyor 56. Component reservoirs 60 are disposed on either side of transport mechanism 52 and supply electronic components. Reservoirs 60 can be any suitable device adapted to provide electronic components, such as a tape feeder.

Pick and place machine 50 includes head 62 disposed above base 58. Head 62 is movable between either of component reservoirs 60 and mounting section 54. As can be seen, head supports 64 are movable on rails 66 thereby allowing head 62 to move in the Y direction over base 58. Movement of head 62 in the Y direction occurs when motor 70, in response to a motor actuation signal, rotates ball screw 72 which engages one of head supports 64 to thereby displace the support 64 is the Y direction.

Head 62 is also supported upon rail 68 to allow head movement in the X direction relative to base 58. Movement of head 62 in the X direction occurs when motor 74, in response to a motor actuation signal, rotates ball screw 76 which engages head 62 and displaces head 62 in the X direction.

As can also be seen, head 62 includes body 78, nozzle mount 80, nozzles 82 and sensor 84. Nozzle mount 80 is disposed within body 78 and mounts each of nozzles 82 within body 78. Each of nozzles 82 is movable in the Z direction (up/down) and is rotatable about the Z axis by suitable actuation members, such as servo motors. Sensor 84 is adapted to move in the X direction relative to nozzles 82 to acquire images of components held by nozzles 82. Sensor 84 is coupled to image processor 86. Image processor 86 receives video data from sensor 84 based upon images of components held by nozzles 82. Image processor 86 is adapted through hardware, software, or a combination of both, to calculate respective component orientations of each of the components held by the respective nozzles 82. Image processor 86 then sends suitable orientation information to a controller (not shown) such that each of nozzles 82 is successively displaced to properly mount its respective component upon the workpiece. Although FIG. 1 shows a number of nozzles 82, it is expressly contemplated that pick and place machine 50 can include a singular nozzle to practice embodiments of the present invention.

Figure 2:
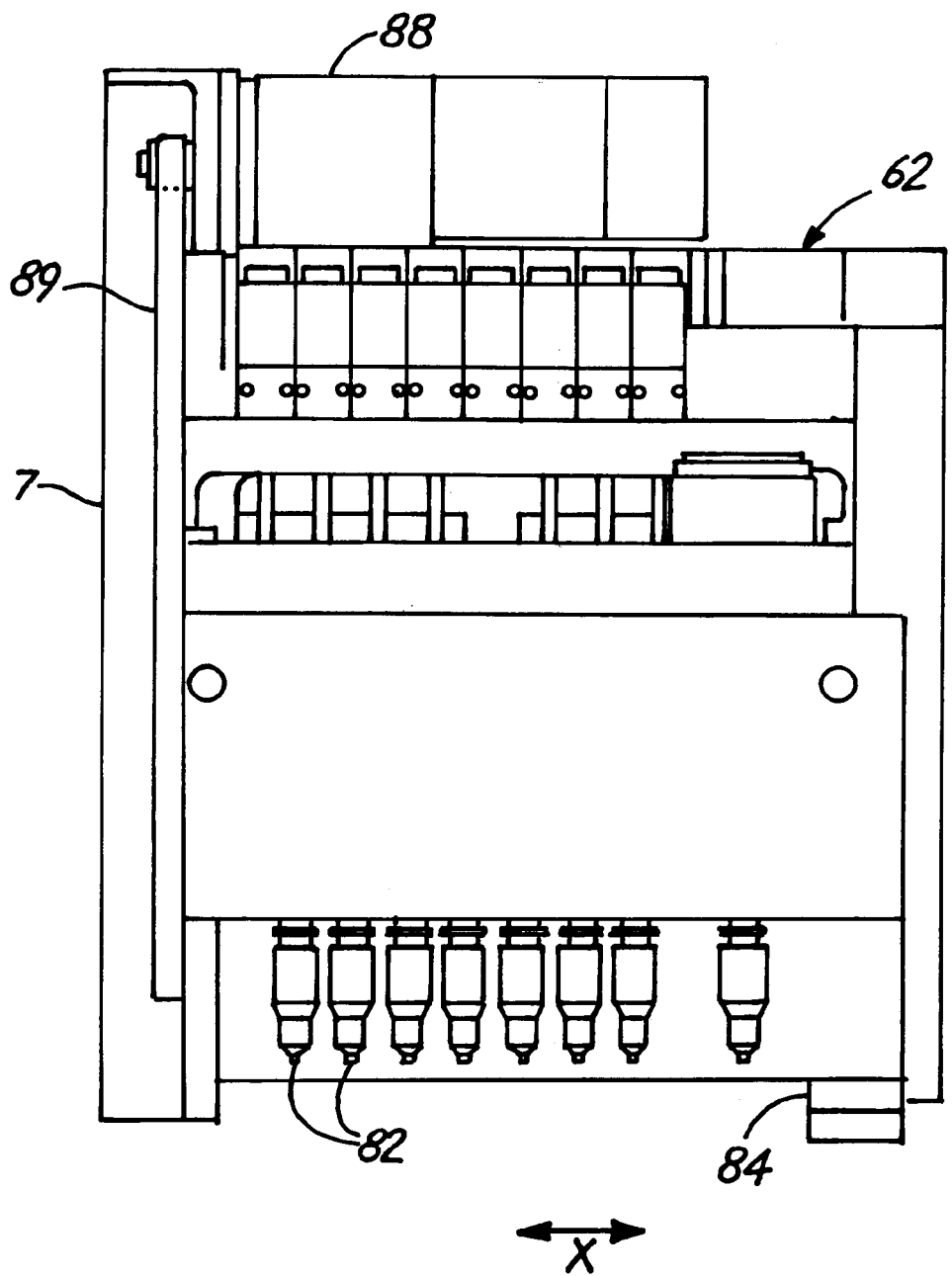
FIG. 2 is an elevation view of a placement head in accordance with an embodiment of the present invention.

FIG. 2 is an elevation view of head 62 in accordance with one embodiment of the present invention. Head 62 includes motor 88 operably coupled to a ball screw (not shown) through belt 89. The ball screw is operably coupled to sensor 84 such that energization of motor 88 causes sensor 84 to move in the X axis direction relative to nozzles 82. Sensor 84 can be adapted to image components coupled to nozzles 82 while scanning in either X axis direction. When such bi-directional scanning is employed, it is useful to provide image processing software that corrects for the fact that the data from scans of opposite directions are essentially flipped around from one another. Additionally, in some bi-directional scanning embodiments, sensor 84 can store the various scanned lines in temporary memory and then send them to the image processing section in correct order.

Figure 3:
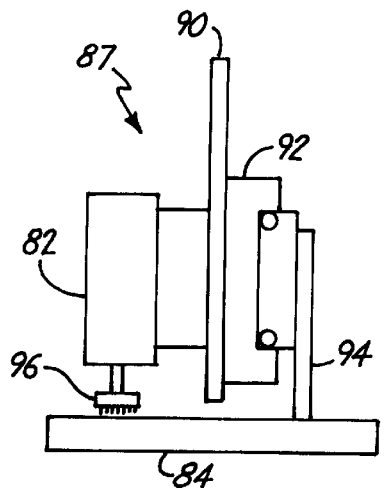
FIG. 3 is a side elevation view of a portion of a placement head in accordance with an embodiment of the present invention.
Figure 4:
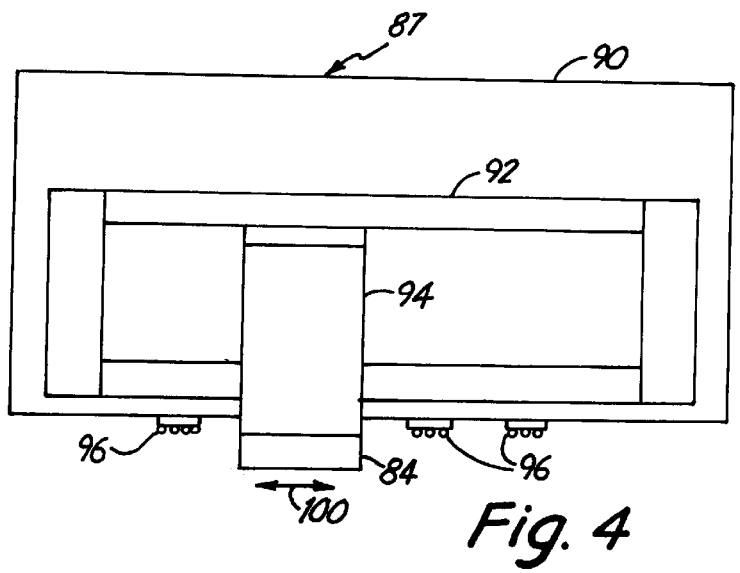
FIGS. 4–6 are rear elevation and two top plan views of a portion of a placement head in accordance with an embodiment of the present invention.

FIG. 3 is an elevation view of head 87 in accordance with an embodiment of the invention. Head 87 includes plate 90 to which nozzles 82 and linear stage 92 are mounted. Sensor 84 is coupled to linear stage 92 via bracket 94 such that sensor 84 is moveable relative to nozzles 82 and thus component 96. As can be seen in FIG. 4 at arrow 100, sensor 84 is moveable in the X axis direction relative to components 96.

Figure 5:
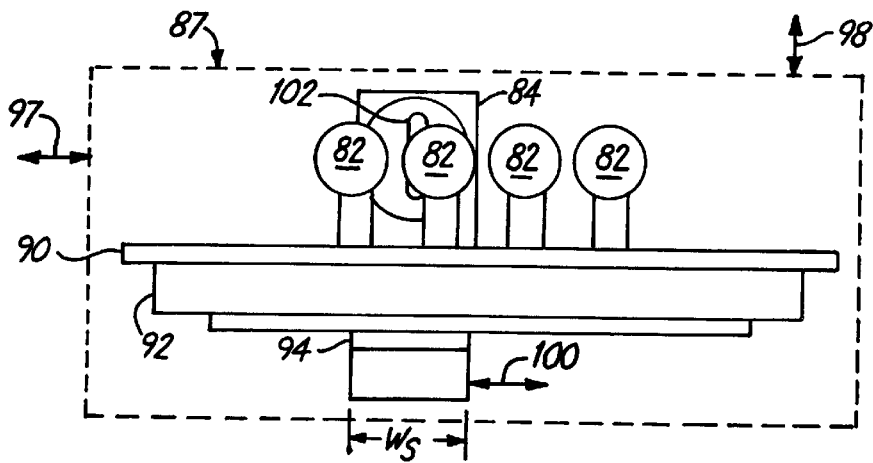

FIG. 5 is a top plan view of head 87 in accordance with an embodiment of the present invention. For clarity, only four nozzles 82 are shown in FIG. 5. However, any appropriate number of nozzles, including one nozzle, can be used. As indicated by arrows 97 and 98, head 87 is movable in X and Y axis directions, respectively. As indicated by arrow 100, sensor 84 is movable in the X axis direction with respect to nozzles 82 via its coupling to linear stage 92. Sensor 84 includes detector window 102 which allows a line of sight between a linear detector (not shown) disposed within sensor 84 and a portion of a component held by one of nozzles 82. The line of sight is preferably parallel to the axis of nozzles 82. Each of nozzles 82 within the pick and place machine can be adapted to pick and place a different type of electrical component. Examples of such different component types include flip-chips, ball grid arrays (BGA's), micro ball grid arrays, quad flat pack (QFP), connector, pin grid array, dual inline package, single inline package, plastic leaded chip carrier (PLCC), chip capacitors, and chip resistors. Moreover, each nozzle 82 can be independently adapted to pick and place a different type of component than other nozzles 82. Because different component types can require different image resolutions, embodiments of the present invention can preferably change image resolution based upon component type.

Figure 6:
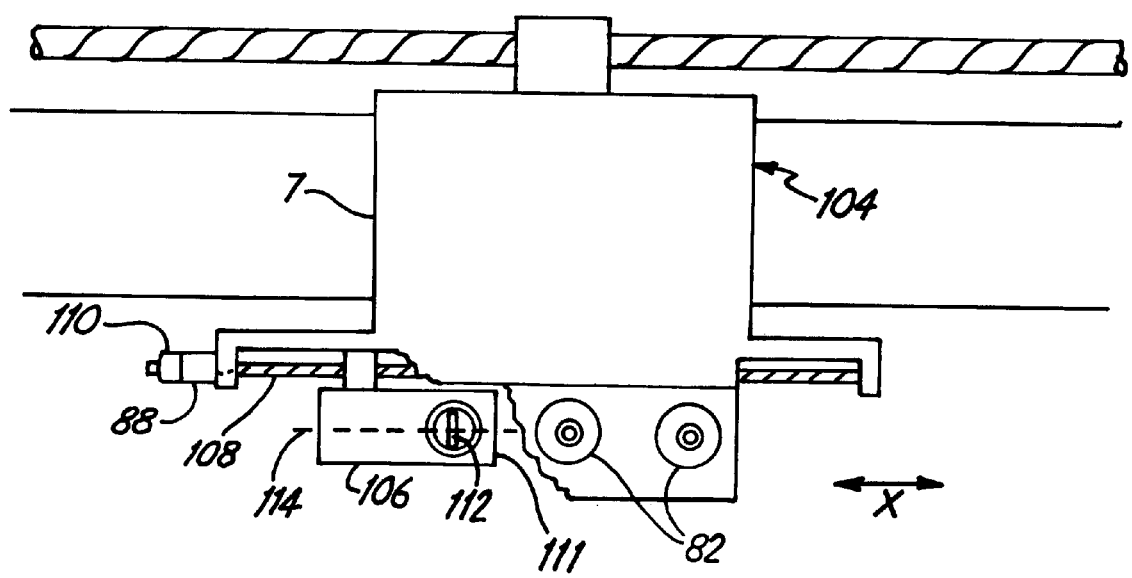

FIG. 6 is a top plan view of placement head 104 for a pick and place machine in accordance with another embodiment of the present invention. Head 104 bears many similarities to head 87, and like components are numbered similarly. As can be seen, head 104 includes body 7 and one or more nozzles 82. Sensor 106 is moveable relative to nozzles 82 since sensor 106 is coupled to motor 88 via ball screw 108. Motor 88 also includes encoder 110 that provides a feedback signal indicative of rotational displacement of ball screw 108 and thus axial displacement of sensor 106 in the X direction. In contrast to sensor 84 shown in FIG. 5, sensor 106 includes a detector window 112 that is perpendicular to a longitudinal axis 114 of sensor 106. Detector window 112 can be positioned anywhere on sensor 106. Thus, if sensor 106 is adapted to scan components in a single direction (for example while moving to the right) then window 112 can be disposed proximate a leading edge 111 of sensor 106 such that components are scanned more quickly. In embodiments where sensor 106 is adapted to scan components in either direction (left and right) window 112 is preferably centered upon sensor 106.

Figure 7:
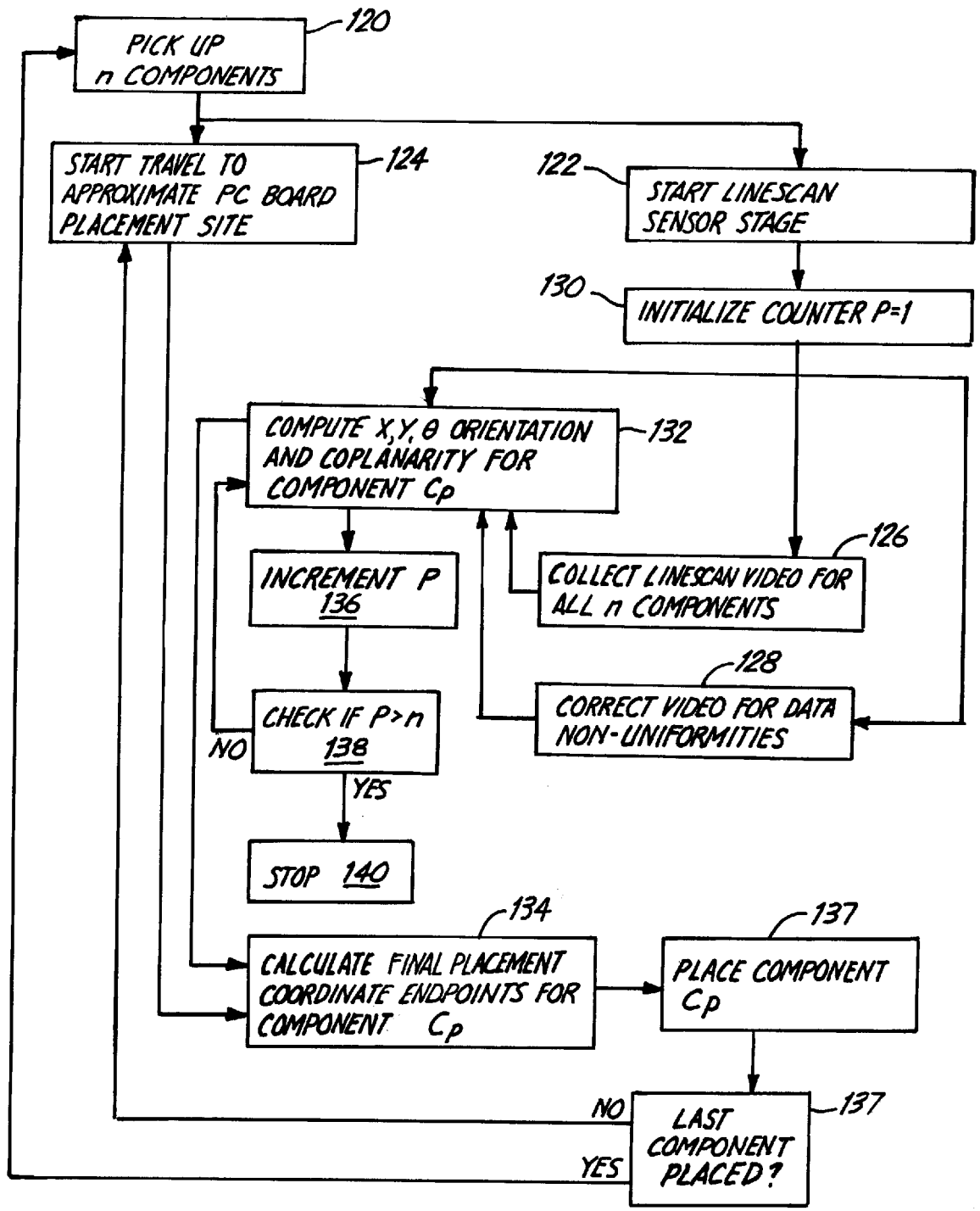
FIG. 7 is a flowchart of a method of picking and placing components in accordance with an embodiment of the present invention.

FIG. 7 is a flowchart of a method of picking and placing n components upon a workpiece in accordance with the present invention. Throughout this document, sequential operations for practicing the method of the present invention are disclosed. It is understood that for any successive sequential operations, that the first operation need only be commenced before the second operation is started. At block 120, n components are picked up by a pick and place machine head, such as head 87. Subsequently, blocks 122 and 124 are initiated. Thus, a linescan camera begins moving relative to the components as indicated by block 122 and the head begins traveling to the approximate position or site on the workpiece where the first component will be mounted. Preferably, blocks 122 and 124 are executed substantially simultaneously.

At block 130, a counter (P) is initialized to equal 1. Counter P is used to track which component coordinates are being computed, as will be described in greater detail with respect to the rest of FIG. 7. After block 130, blocks 126, 128, and 132 preferably begin execution. Preferably, blocks 122, 126, 128 and 130, among others, execute while the head is transporting components to the approximate placement site. Although such blocks are illustrated and described as executing at least partially in parallel, it is contemplated that such blocks can execute sequentially.

At block 126, the linescan camera passes all n components and collects video data based upon the components. At block 128, the video data is corrected for non-uniformities. Such non-uniformities may be due to changes in sensor scan speed that occur while scanning is performed.

At block 132, X, Y and θ offset adjustments for component $c_p$ are computed. Height information is computed in accordance with embodiments of the invention set forth later in the specification. The height information is useful for assessing the location of pins, columns or leads (as appropriate for the component in view), the absence or presence of certain features on the component, such as balls, pins, columns or grids, the distance between leads if the component under test is leaded, or a computation of coplanarity. Once the height of a feature is computed, the coplanarity of that feature with respect to a reference plane may be computed. In a coplanarity computation, a reference plane is selected which is formed by at least three of the features (typically balls, columns or pins) and the deviation of any particular feature from the plane is computed and reported, although in many instances the deviation, computed as an average, standard deviation or the like, is compared to a threshold value to determine whether the component should be discarded or placed.

The computed offset adjustments are used in block 134 to calculate final part placement coordinate endpoints for component $c_p$. After component offset adjustments have been computed, counter P is incremented as indicated in block 136. The machine then checks to determine whether the incremented counter (P) exceeds the number of components (n) picked up in block 120, as indicated at block 138. If the incremented counter exceeds the number of components, then control passes to block 140 and offset calculations cease. However, if the incremented counter does not exceed the number of components, control returns to block 132 and offset adjustments for component cp are computed. The loop continues with block 132 providing computed offset adjustments to block 134 until offset adjustments have been computed for all n components.

After block 134 receives the placement coordinates, part $c_p$ is placed as indicated at block 137. At block 139, the machine checks to determine whether $c_p$ is the last component. If component $c_p$ is not the last component, control returns to block 124 and the head begins moving to the approximate placement site of the next component. However, if all n components have been placed, then control returns to block 120 and an additional n components are picked up and the method repeats. Preferably, the various steps of placing parts occur while component offset adjustments are calculated.

Figure 8:
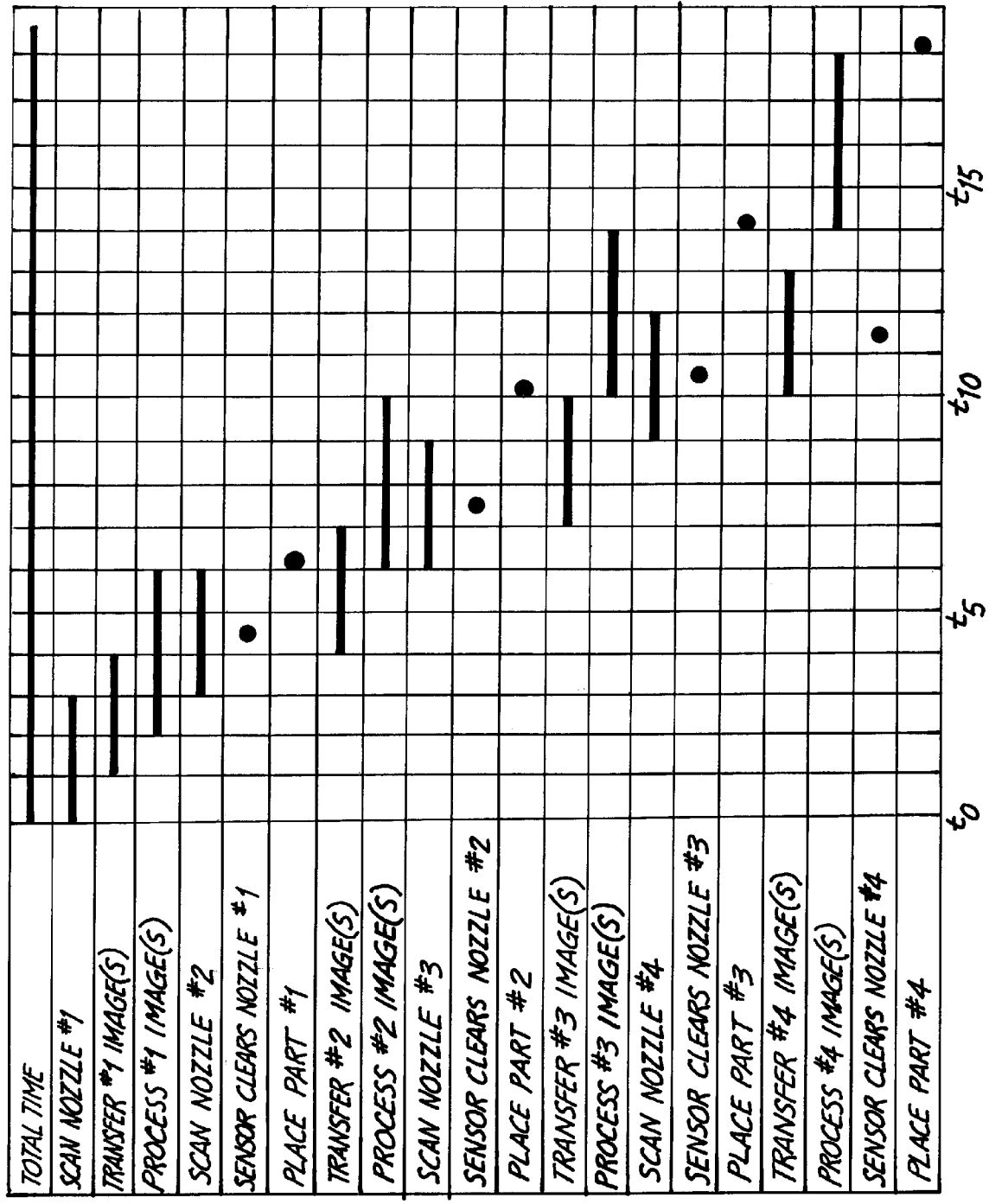
FIG. 8 is a timing diagram of component placement in accordance with an embodiment of the present invention.

FIG. 8 is an example scan timing chart for a pick and place machine having four nozzles in accordance with an embodiment of the present invention. The vertical lines in FIG. 8 indicate specific time intervals. As can be seen, at time to scanning of nozzle #1 begins. For the example illustrated in FIG. 8, nozzle scanning requires three time intervals for completion. Thus, nozzle scanning which begins at time to will finish at time $t_3$. As can be seen, while nozzle #1 is scanned, partial images of the component held by nozzle #1 begin to be transferred at time $t_1$. At $t_2$, while the nozzle is still being scanned, and while the image is still being transferred, video processing begins. At time $t_3$, scanning of nozzle #1 has completed and scanning of nozzle #2 begins even while partial images of the component held by nozzle #1 are still being transferred and processed. During time $t_4$, the sensor clears nozzle #1 thereby allowing component #1 to be placed, which occurs during time $t_6$. As can be seen, component #1 is placed even while partial images are of component #2 are transferred and processed. Thus, those skilled in the art will appreciate that the various steps of scanning, transferring, processing, and placing can overlap to some extent, temporally. Although the description of FIG. 8 indicates that the video data windows are processed in sequential order, such notation is provided for clarity since in some instances it is advantageous to process video windows in an order that enhances assembly throughput. Such processing order can be based upon image collection order, placement order, processing time, and travel time between subsequent sites. Thus, it is expressly contemplated that component images can be processed in an order that differs from the order in which the components were picked up by the head.

Figure 9:
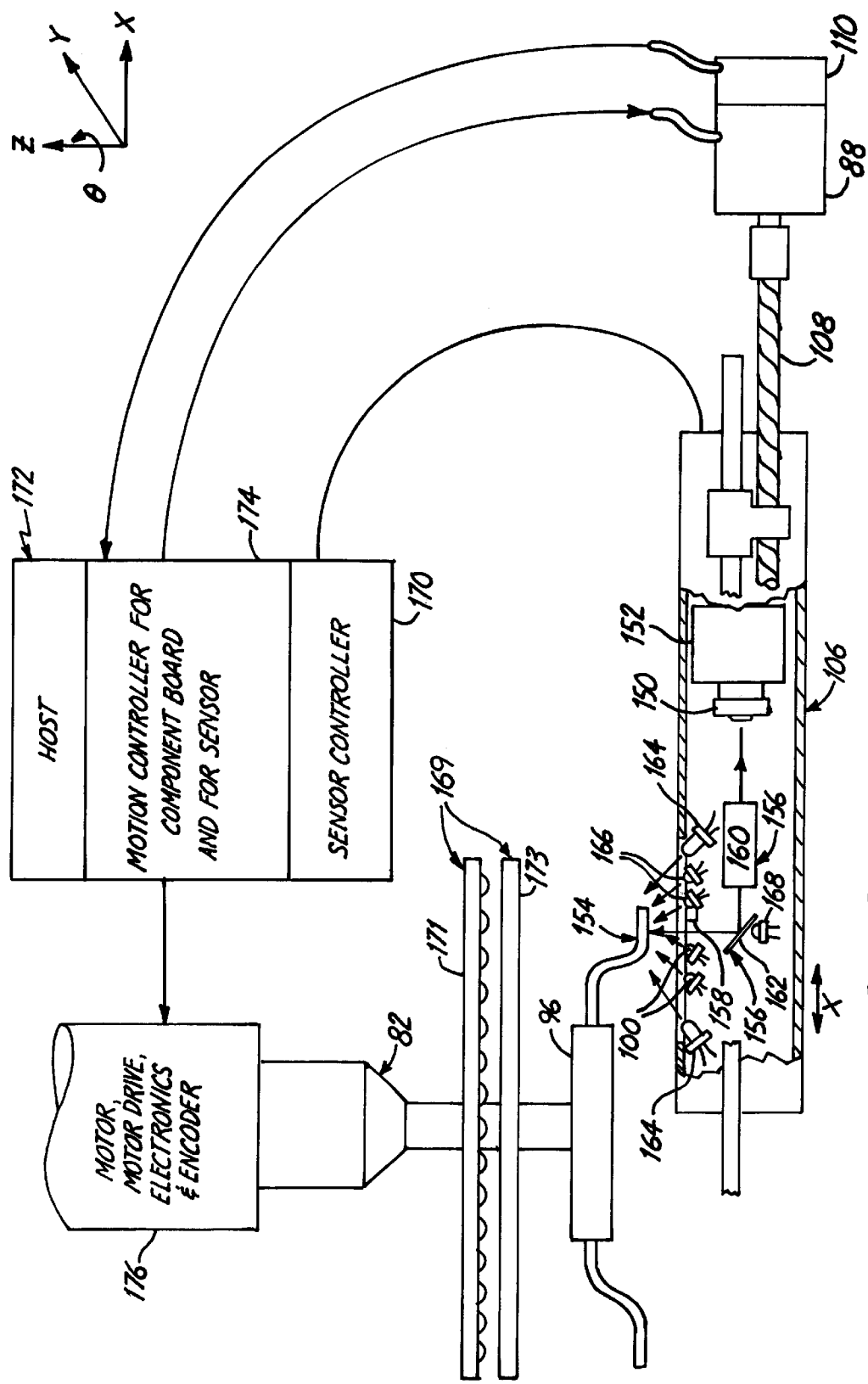
FIG. 9 is a diagrammatic view of a portion of a pick and place machine in accordance with an embodiment of the present invention.

FIG. 9 is a diagrammatic view of sensor 106, which is adapted to generate a two-dimensional image of component 96 as sensor 106 scans a portion of component 96. Sensor 106 is operably coupled to motor 88 via ballscrew 108. Motor 88 is operably coupled to encoder 110 which provides an indication of rotary displacement of ballscrew 108 and thus axial displacement of sensor 106 along the X axis. A linear glass scale type encoder could be substituted for encoder 110.

Sensor 106 includes linear detector 150 coupled to sensor electronics 152. Linear detector 150 is preferably a charge coupled device (CCD) comprising a number of photoelements (pixels) arranged in a line. Preferably, the size of each pixel is approximately 14 microns square. Detector 150 is preferably manufactured by Dalsa Inc., of Waterloo Ontario and is model no. IL-CC-2048, although other types of linear detectors may be used in the present invention. Linear detector 150 is optically coupled to a portion of leads 154 through imaging optics 156 and detector window 158. Imaging optics 156 can include lens system 160 and partial mirror 162.

Preferably, sensor 106 also includes one or more illuminators. The embodiment shown in FIG. 9 includes darkfield illuminators 164, diffuse illuminators 166, brightfield illuminator 168, and backlight illuminator 169. As used herein, darkfield illumination is intended to mean illumination which impinges upon the component at a high angle of incidence. Diffuse illumination, as used herein, is intended to mean illumination impinging upon the component at a lesser degree of incidence. Brightfield illumination, as used herein, is intended to mean illumination which impinges upon the component at a substantially zero incidence angle. Thus, brightfield illumination can also be considered specular or through-the-lens illumination. Backlight illumination as the term is used herein, is intended to mean illumination which originates from a position behind the component with respect to the sensor. The combination of these four types of illuminators is helpful to provide enhanced inspection capabilities with the sensors of the present invention, since the illumination types and their various combinations allow features to be identified with greater resolution.

In operation, sensor 106 is moved along the X-axis with respect to component 96. While in motion, sensor 106 acquires individual linear images, or partial images, of portions of component 96. By storing multiple linear images and correlating the individual images with sensor location information provided by encoder 110, an image of component 96 can be constructed.

Illumination emanating from any of darkfield illuminators 164, diffuse illuminators 166 or brightfield illuminator 168 is reflected by a portion of component 96 proximate detector window 158. Additionally, backlight illumination from illuminator 169 can be used, where illumination emanates from source 171 and passes through diffuser 173 to backlight the component. The reflected illumination is redirected by partial mirror 156 through lens system 160, and thereby focused upon linear detector 150. Each individual pixel of linear detector 150 provides a representation of the sum of illumination incident on the pixel during an integration period. Lens system 160 can be any suitable optical device capable of focusing an object line upon linear detector 150. Thus, lens system 160 can be a refractive lens system or a diffractive lens system. Such a refractive lens system can preferably include a gradient index (GRIN) lens array, available from NSG America, Inc., of Somerset N.J., or a traditional refractive lens system. A diffractive lens system can include a holographic lens array.

Sensor 106 is coupled to sensor controller 170 of host 172. Sensor controller 170 can receive and store each individual image line in a frame buffer, and provide suitable signals to sensor 106 to control the intensity of any of illuminators 164, 166, 168, and 169. Since host 172 is coupled to encoder 110, sensor controller 170 can provide illumination intensity signals to any of the illuminators based upon position of sensor 106 along the X-axis or based upon the scan speed of sensor 106 along the X-axis. Host 172 also includes motion controller 174 that is coupled to motor 88, nozzle motor 176 and a nozzle encoder (not shown). Thus, host 172 acquires an image of component 96 from linear detector 150 as sensor 106 is moved in the X direction relative to component 96. Host 172 is adapted through suitable software, hardware, or both, to compute a current orientation of component 96 in X-axis, Y-axis, and θ directions. Based upon the computed orientation, host 172 causes motion controller 174 to issue suitable motion commands to motors 70, 74 (shown in FIG. 1) and nozzle motor 176 to cause nozzle 82 to deposit component 96 in a desired component position and orientation on the workpiece. Motion controller 174 is adapted to vary scan speed.

Figure 10:
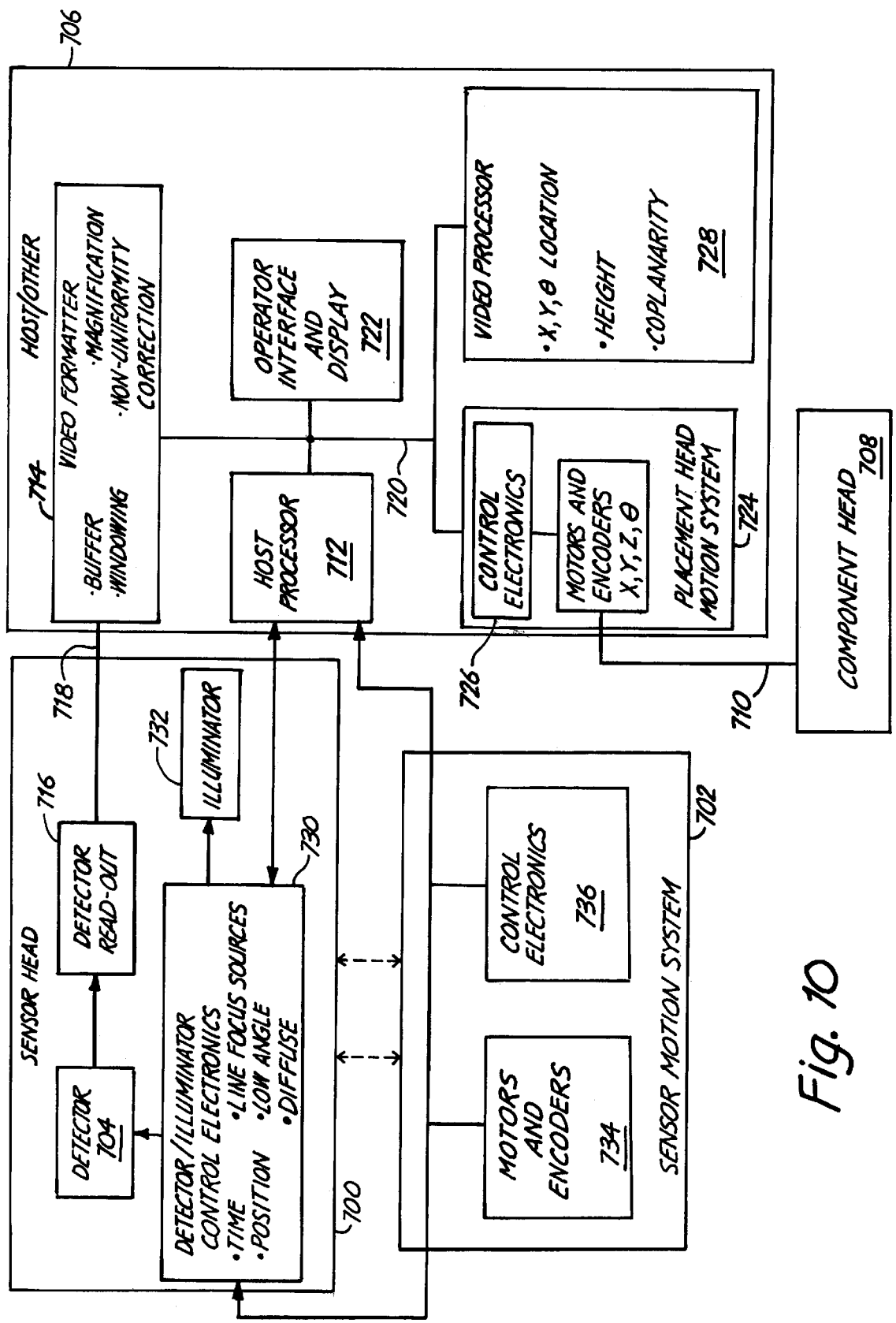
FIG. 10 is a system block diagram of a portion of a pick and place machine in accordance with an embodiment of the present invention.

FIG. 10 is a system block diagram of one embodiment of the height sensing sensor of the present invention and shows sensor head 700 mechanically coupled to a sensor motion system 702, which provides uniaxial motor drive for head 700. Preferably the system is "on-head", since sensor head 700 moves with component head 708. On a system-level basis, sensor head 700, sensor motion system 702, host 706 and component head 708 form a closed control loop 709 (not shown). In control loop 709, host processor 712 sends a desired placement signal to the component head motor drive 724. System 724 starts to move the component head 708 to the nominal placement location. Then, the combination of sensor head 700 and sensor motor system 702 scan the component to provide partial images of the component during the scan, the video formatter 714 assembles a plurality of partial images to form 1, 2, 3, or more assembled images of the component, and then video processor 714 processes the assembled images to compute an x, y, and θ orientation of the component, the height of certain features and optionally the coplanarity. Height computation uses any two of the assembled images. Computation of X, Y, θ can use a single normal incidence assembled image. Additionally, X, Y, θ can also be computed from two "angled" assembled images. Video processor 728 sends the orientation information to host processor 712 in pick and place machine 706, which computes a correction signal as a function of a desired orientation and the present orientation. The correction signal is provided to the placement head 708 to properly orient and place the component. A host processor 712, within pick and place machine 706, sends a desired placement location to component head 708 via bus 720 and bus 710.

Video formatter 714 receives outputs from detector readout block 716 in sensor head 700, via bus 718. The function of formatter 714 is preferably carried out in a separate electronic chip than processor 712, but if a minimum of functionality is desired, they may be embodied in the same component. Formatter 714 collects partial images that it receives, and assembles the partial images into first and second, and optionally third assembled images. Additionally, formatter 714 optionally performs windowing of specific areas of the assembled images, (e.g., corners), performs magnification of specific areas and also may provide non-uniformity correction of the assembled images, where one of the dimensions of the image is disproportionately modified with respect to other dimensions of the assembled image, due to non-uniform spacing of partial images in time or space.

Internal bus 720 connects formatter 714, processor 712, operator interface and display 722, placement head motion control system 724 and video processor 728. In addition to providing a desired placement location for the component to placement head motion system 724, processor 712 also provides various timing signals for proper operation of the pick and place machine 706. For instance, when the pick and place machine has more than one component head, host processor includes suitable collision avoidance functionality to prevent collisions between the various component heads and between the sensor and the nozzles. Operator interface and display 722 allows the operator of the pick and place machine to program specific movements and associated timing of scans, as well as overall operation and diagnostics of the pick and place machine. A video display of the assembled image is also displayed for the operator.

Placement head motion control system 724 includes a set of x, y, z, and θ motors for moving component head 708 in the x, y, z, and θ directions, as well as control electronics 726 for timing such movements and re-formatting the electrical digital signals from host processor 712 into analog signals generally required to drive the x, y, z, and θ motors. A bank of x, y, z, and θ encoders encodes the position of component head 708 and provides these signals to host processor 712.

Video processor 728 can be a microprocessor such as an Intel Pentium® processor. It is preferably included in every embodiment of the present invention, since it provides the basic x, y, and θ location information necessary to allow host processor 712 to properly place the component. Processor 728 receives two assembled images, each image comprises gray-scale pixel values, to compute height of a selected feature. Once the height is computed in processor 728, computer 728 preferably computes the coplanarity of the features by selecting at least three points to define a plane and then using known methods such as a least squares fit to measure how much the height of the feature deviates from the computed reference plane. The coplanarity of a plurality of points is typically calculated by a maximum deviation between each of the points and the reference plane. Once coplanarity is computed, a measure of the quality of the component can be provided as a function of some golden standard measurement (e.g. threshold, tolerance).

Height measurement is useful for tombstone detection. Tombstoning is an undesirable condition in which the component is picked up by a surface other than that opposite the mounting surface. One example of tombstoning is when a chip capacitor is picked up in such a way as to extend partially into the nozzle. Such condition is undesirable because the pick and place machine cannot correct the orientation in order to mount the tombstoned component. Tombstone detection can be effected by measuring the height of the component with respect to the known height of the nozzle.

Video data from detector 704 may be sampled in one of two ways. The first is to sample the detector data as a function of encoder position from the encoder output from block 734. The second method is to sample detector data as a function of time, from a free-running clock within block 730.

An illuminator 732 preferably resides in sensor head 700, and illuminator control electronics 730 also control the operation of illuminator 732 to provide illumination from one or a combination darkfield illuminators, and a source for diffuse illumination, brightfield illumination, or backlight illumination.

Finally, control electronics 736 within sensor motion system 702 provide timing and position instructions to head 700. A control loop is formed by control electronics 736, which sends out instructions representative of the desired position for head 700 and motor/encoders 734, and head 700. The time constant of this control loop, however, should be less than the time constant of control loop 709, since the line scan sensor should scan faster than the time required to place the component.

Figure 11A:
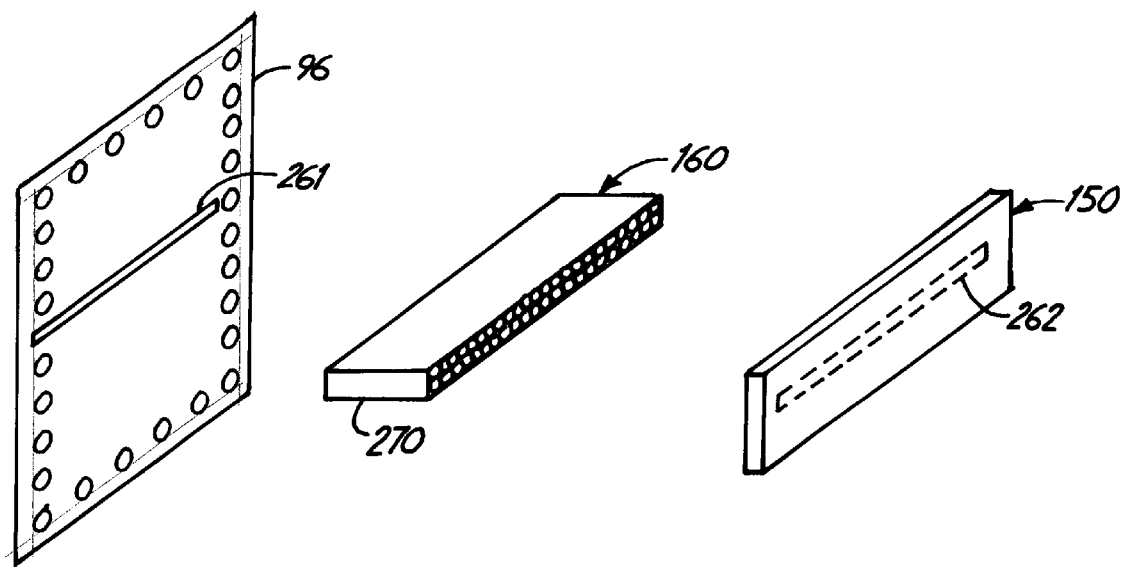
FIGS. 11a and 11b are perspective and side elevation views of a gradient index lens array imaging system.
Figure 11B:
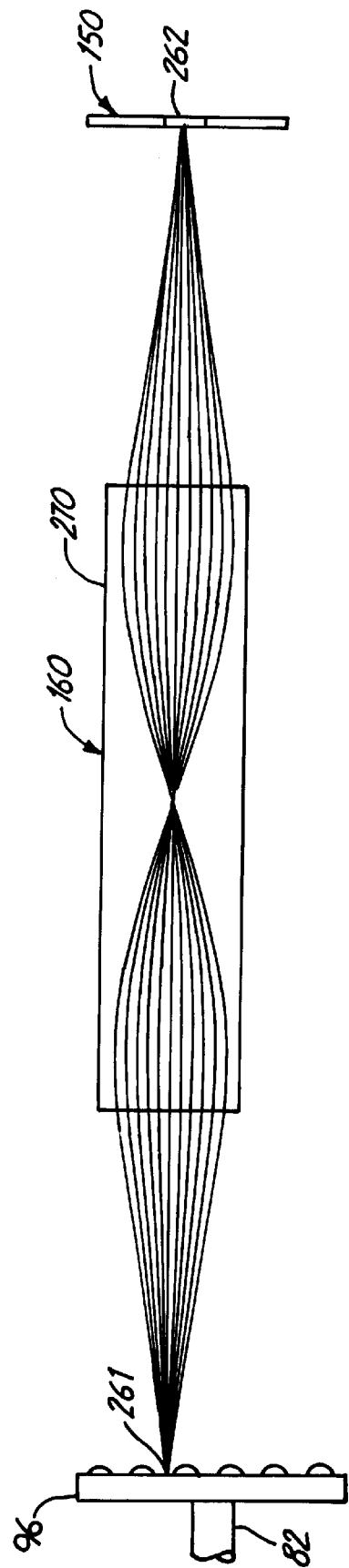

FIGS. 11a and 11b are diagrammatic views of lens system 160 in accordance with an embodiment of the present invention. The system shown in FIGS. 11a and 11b includes a gradient index (GRIN) lens array. A gradient index lens is an optical element within which the refractive index is a smooth, but not constant, function of position and, as a result, the ray paths are curved. This is also known as a graded index lens. The ray curving characteristic of GRIN lens 270 is shown in FIG. 11b where rays emanating from object line 261 enter GRIN lens 270 and begin to curve as indicated. Rays exiting GRIN lens 270 converge and are focused at 262 upon linear detector 150. A GRIN lens array provides a large, compact field of view for imaging systems of embodiments of the invention. Although GRIN lens 270 is shown as an example of lens array 160, any suitable optical element capable of focusing object line 261 upon a linear detector can be used. The compact nature of the present invention with the GRIN lens array allows for the pick and place machine of the present invention to have a reduced nozzle "z" stroke. A reduced nozzle "z" stroke is essential to rapid placement of components, since each time a component is placed, the nozzle must be lifted in order to clear the sensor for scanning and then lowered by approximately the same distance to place the component.

Height computations in the embodiments of the present invention are premised on the idea that two views of the same feature from different viewing angles provide enough information to compute feature height. The relative displacement of the object in these two views is directly related to the height of the object. This will be explained in greater detail with reference to FIGS. 12–14b.

Figure 12:
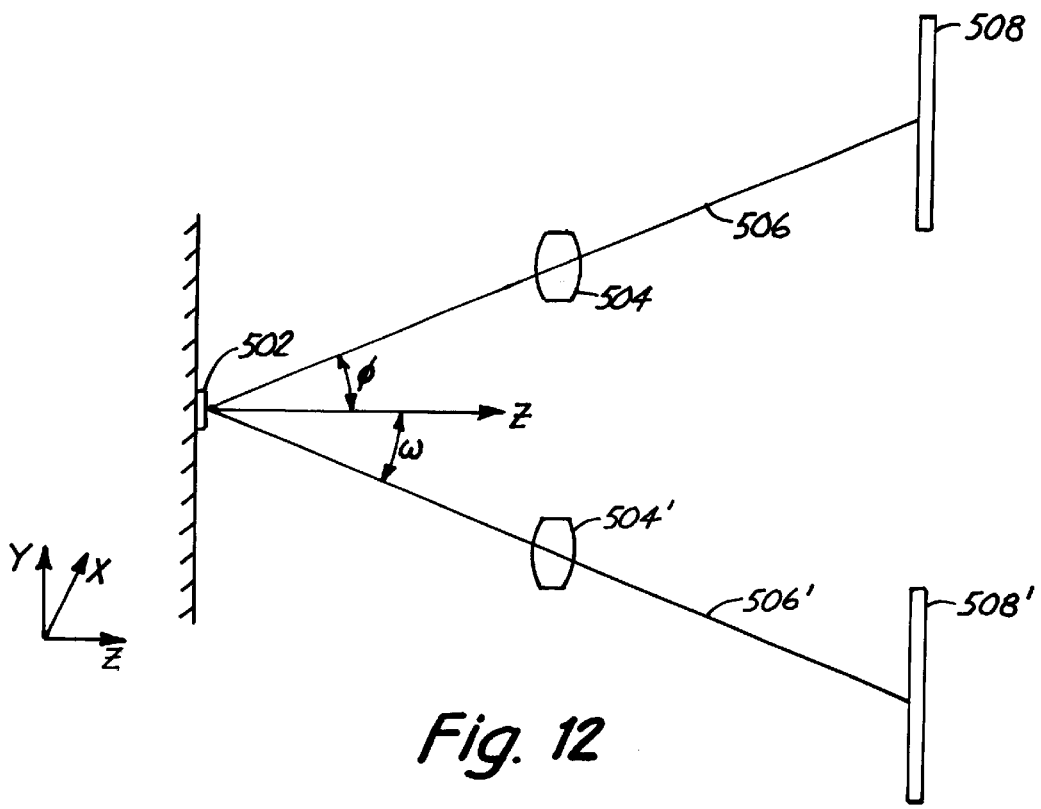
FIGS. 12 and 13 are diagrammatic views of a stereo imaging system.
Figure 13:
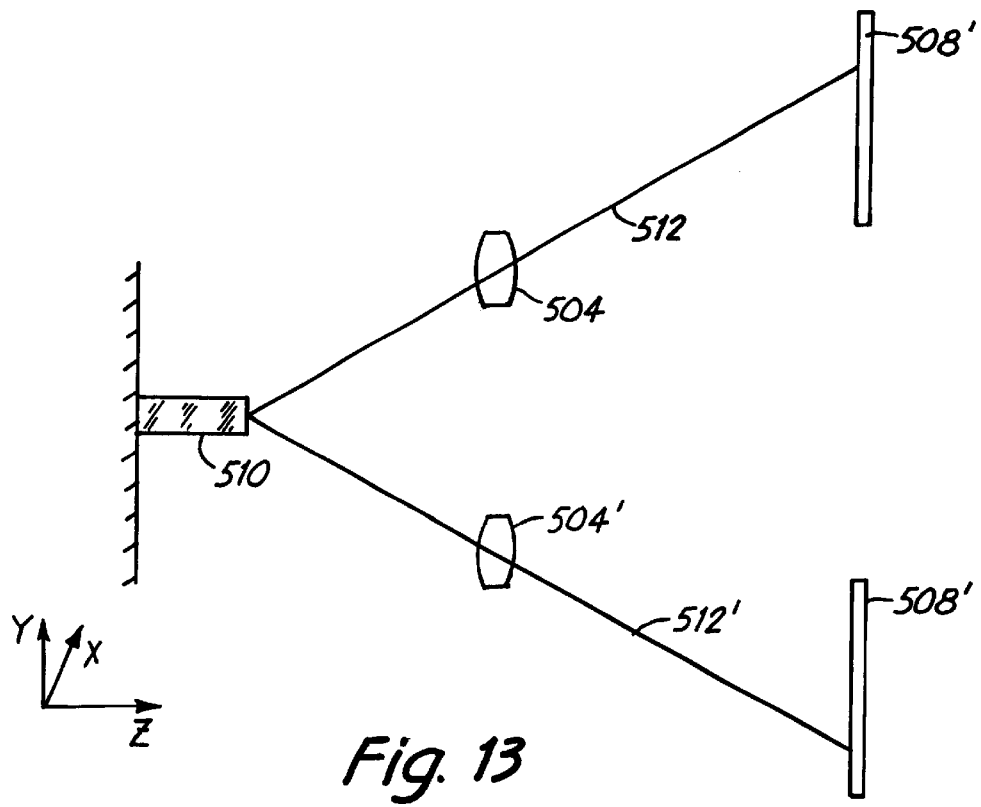

In FIG. 12, object 502 is imaged onto linear detectors 508 and 508' by lenses 504 and 504', respectively. The position of the images on detectors 508 and 508' is determined, respectively, by chief rays 506 and 506'. Chief rays 506 and 506' make angles ø and ω, respectively, to the Z axis. In FIG. 13, object 510 is shown with substantially larger height than object 502 in FIG. 12. Chief rays 512 and 512' determine the respective image positions of object 510 on detectors 508 and 508'.

Figure 14A:
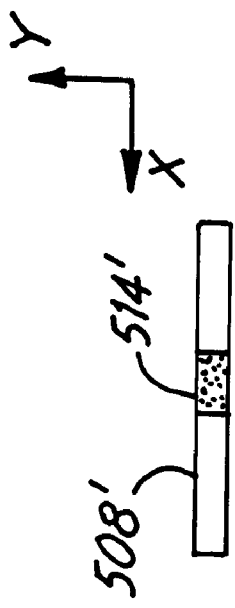
FIGS. 14a and 14b are diagrammatic views of a detector in the X-Y plane.
Figure 14A:
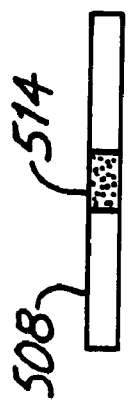
Figure 14B:
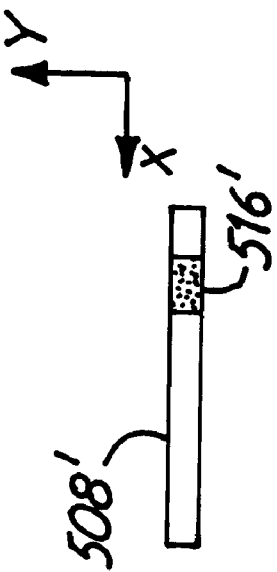
Figure 14B:

FIG. 14a is a view of detectors 508 and 508' in the X-Y plane. The images of object 502 are shown by 514 and 514'. FIG. 14b is also a view of detectors 508 and 508' in the X-Y plane. The images of object 510 are shown by 516 and 516'. Since object 510 has larger height than object 502, it is seen that the images, 516 and 516', of object 510 are separated by a larger distance than the images, 514 and 514', of object 502. The separation of the feature images in a stereo vision application is therefore directly related to the height of the object being viewed. The vision processing system, therefore, preferably performs a correlation calculation to locate a given feature in each assembled image and calculates its separation distance between the two assembled images. It should be appreciated by those skilled in the art that a variety of other methods of computing feature location can be used, and such methods are expressly contemplated. Due to manufacturing tolerances, the height as a function of image separation must be carefully calibrated after the stereo vision sensor is assembled.

In view of the above discussion, some embodiments of the invention will be described with respect to the remaining figures.

FIG. 15 shows a telecentric imaging system. Object 534 is imaged onto linear detector array 532 through lenses 528 and 530 in accordance with known optical principles. Although lenses 528 and 530 are illustrated as simple lenses, each of lenses 528 and 530 can, in practice, be a complex optical system. Chief rays 520, 522, and 524 show three points 562, 564, and 566 on object 534 being imaged onto linear detector 532. Points 562, 564, and 566 are imaged onto points 572, 574, and 576, respectively. Since the imaging system is telecentric, chief rays 520, 522, and 524 are parallel to each. Also, by definition, chief rays 520, 522, and 524 travel through the center of aperture stop 526. Chief rays 520, 522, and 524 are also perpendicular to object surface 534. Chief ray 522 also lies along a line through an axis of optical symmetry 560.

FIG. 16 is the same as FIG. 15 except for the addition of ray bundles 536, 538, and 540 being shown. These ray bundles fill aperture stop 526 and define the maximum cone angle of collected energy by the imaging system for the object point shown. For example, only the light emitted from object point 562 within ray bundle 540 is imaged to point 572 on linear detector array 532. This is because aperture stop 526 blocks all rays emitted from object point 562 that are outside ray bundle 540. Only the chief rays will be shown in the remaining figures for purposes of clarity, but it should be understood that there is a finite bundle of rays surrounding each chief ray which fill the aperture stop. Also, by definition, where the chief ray of a given point on the object intersects the plane of the detector array defines the image location for that point.

Figure 17:
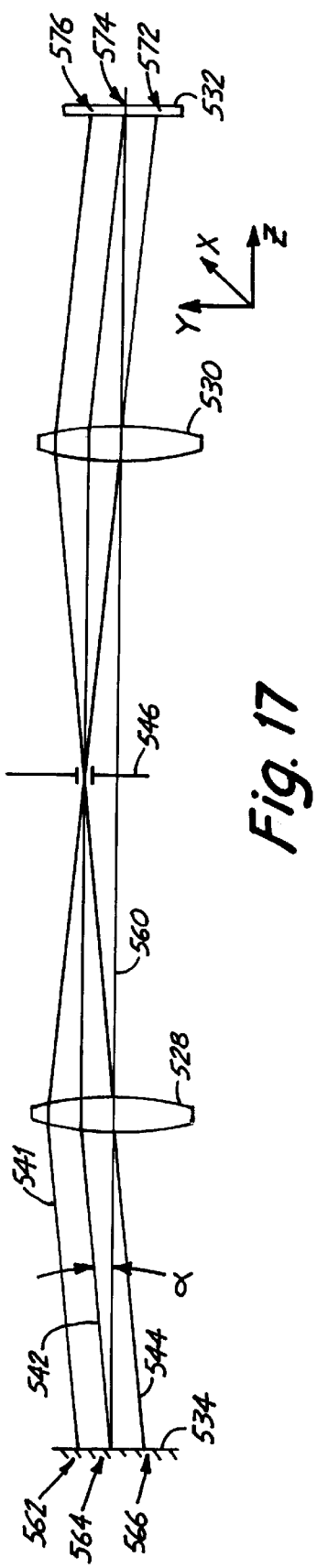
FIG. 17 is a diagrammatic view of another telecentric imaging system.

In FIG. 17, aperture stop 546 has been displaced vertically compared to the position of aperture stop 526 shown in FIG. 16. Chief rays 541, 542, and 544 are parallel to one another, and make angle α with respect to optical axis 560. Thus, the system is still considered telecentric. Just as in FIG. 15 and 16, object points 562, 564, and 566 are aligned to point 572, 574, and 576, respectively. displacing aperture stop 546 vertically has the effect of viewing object 534 from an angle α.

Figure 18:
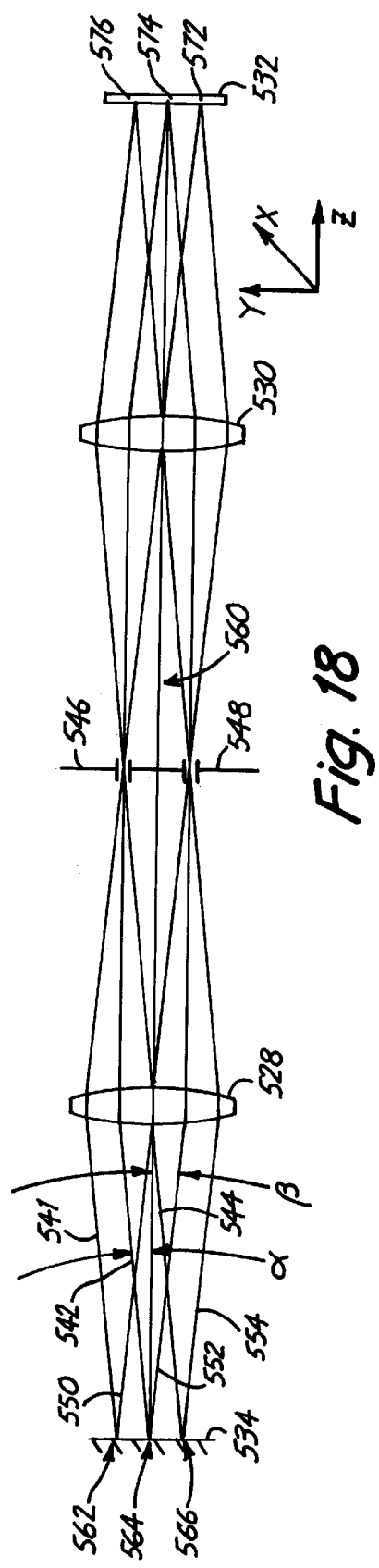
FIG. 18 is a diagrammatic view of another optical system.

FIG. 18 illustrates the same optical system as FIG. 17 except for the addition of displaced aperture stop 548. Chief rays 550, 552, and 554, which go through the center of aperture stop 548, make angle β with respect to the optical axis and have the effect of viewing object 534 from an angle β. This system is similar to the stereo optical system illustrated by FIGS. 12 and 13 since it views an object from two different angles. One important difference between the two systems is that FIG. 18 illustrates stereo images being projected onto the same linear detector 532, whereas in FIGS. 12 and 13 the stereo images are formed on separate linear detector arrays 508 and 508'.

Figure 19:
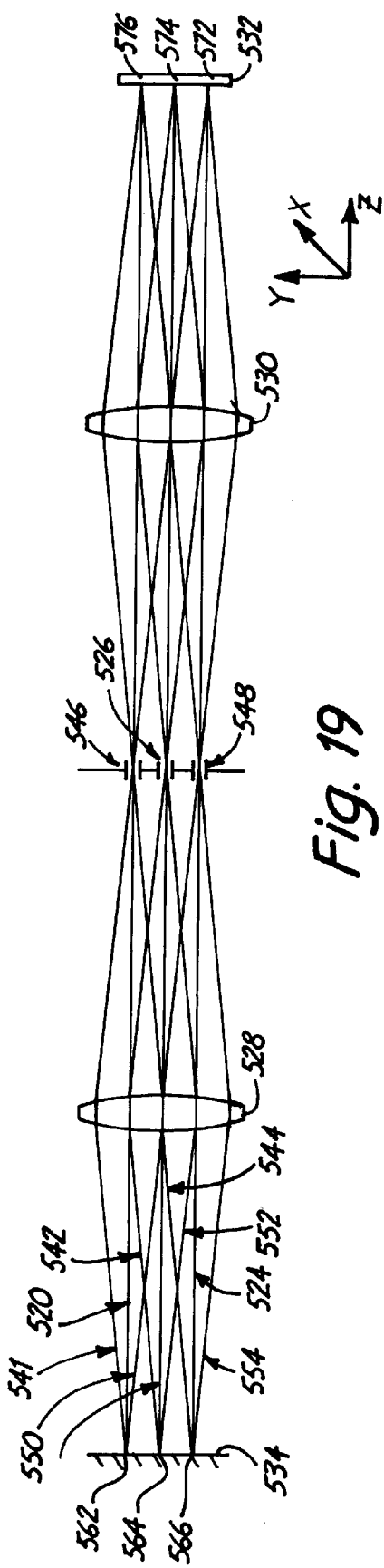
FIG. 19 is a diagrammatic view of an optical system imaging multiple ray bundles.

FIG. 19 illustrates the same optical system as FIG. 18 except for the addition of aperture stop 526 which was shown in FIG. 16. The optical system shown in FIG. 19 views object 534 perpendicularly with aperture stop 526. This optical system also views object 534 from angles α and β with aperture stops 546 and 548, respectively. All three of these views overlap on detector 532. This situation is acceptable as long as object 534 is planar. However, if there are features on object 534 with height, then the three views do not overlap perfectly on linear detector 532. Due to the stereo vision effect, the distance between features in the different views is affected by the height of the features. If object 534 is a complicated object with many features with different heights, the image can become blurry and confused. In order to take advantage of the stereo vision effect to measure the heights of features, the embodiment shown in FIG. 19 can be adapted to separate the three views onto three linear detectors.

Figure 20:
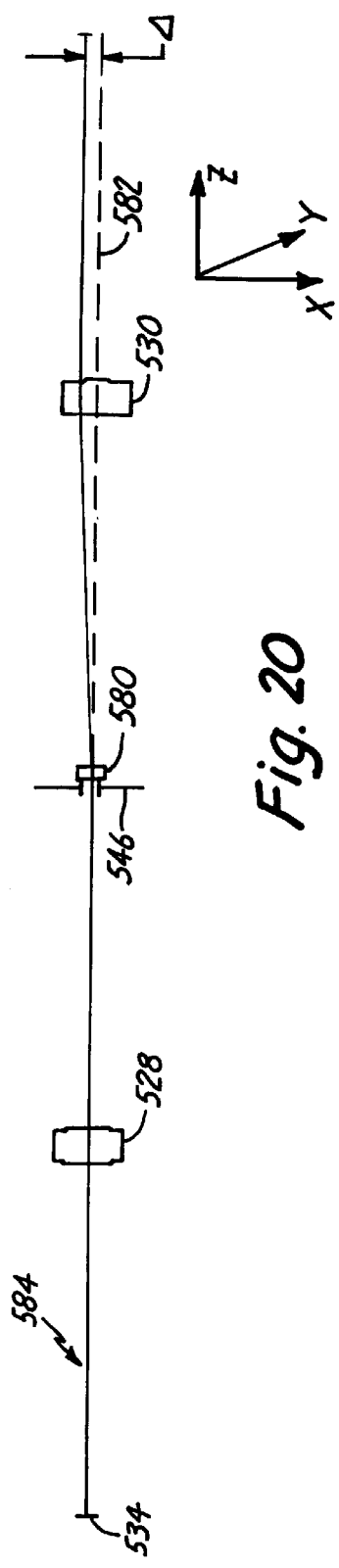
FIG. 20 is a diagrammatic view of an optical system including a prism.
Figure 21:
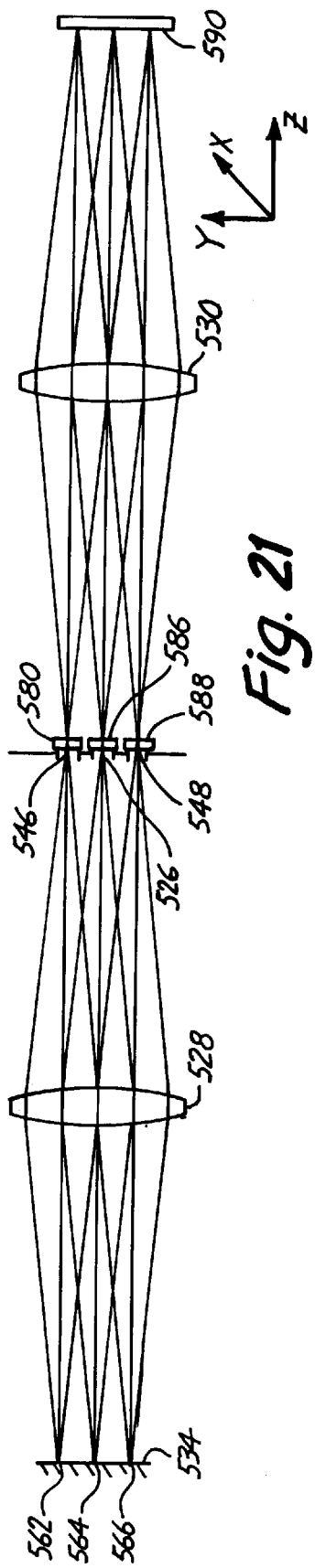
FIG. 21 is a diagrammatic Y-Z plane view of a portion of an optical system in accordance with an embodiment of the present invention.

In order to separate the three views shown in FIG. 19, consider the X-Z plane view of FIG. 20. In FIG. 20, prism element 580 is disposed just after aperture stop 546. If prism element 580 were absent, then chief ray 584 would travel along dashed path 582 after exiting aperture stop 546. Prism element 580 deflects chief ray 584 at a slight upward angle. Chief ray 584 intersects the image plane at a distance Δ above dashed line 582. The three views of object 534 can be separated onto three linear detectors by placing one prism after aperture stop 546 which deflects the ray bundle passing through it at an upward angle, placing another prism after aperture stop 548 which deflects the ray bundle at a downward angle, and placing a plane parallel block of glass after aperture stop 586. A plane parallel block is useful to keep similar optical paths between the three views. This is shown in FIG. 21.

Figure 22:
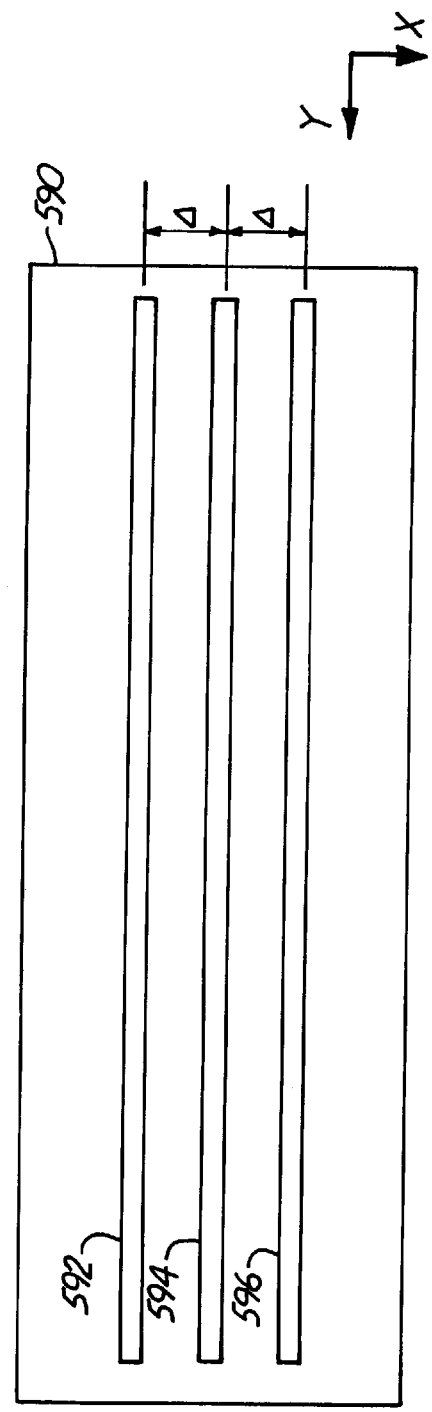
FIG. 22 is a diagrammatic X-Y plane view of a detector in accordance with an embodiment of the present invention.
Figure 23:
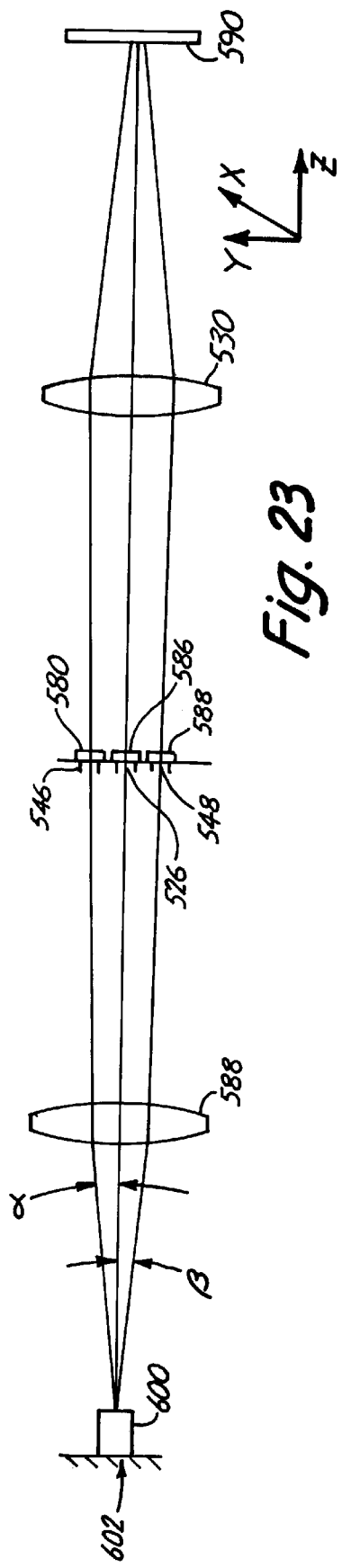
FIG. 23 is a diagrammatic view of a stereo vision optical system in accordance with an embodiment of the present invention.

FIGS. 22 and 23 illustrate a stereo vision system in accordance with an embodiment of the present invention. Linear detector 592, of sensor 590, receives the image of feature 602 viewed at angle β. Linear detector 596 also receives the image of feature 602 viewed at angle α. Linear detector array 594 receives the image of feature 602 viewed in a perpendicular direction to feature 602.

Figure 24:
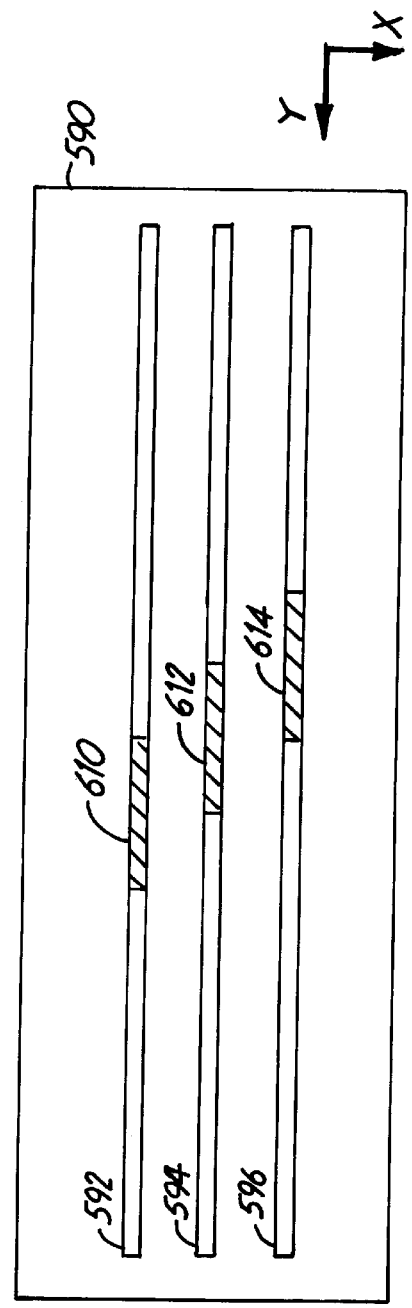
FIG. 24 is a diagrammatic X-Y plane view of the detector shown in FIG. 22, imaging a feature in accordance with an embodiment of the present invention.

FIG. 24 shows an X-Y plane view of detector 590 and the three images of feature 602. These images are labeled 610, 612, and 614. Image 610, 612, and 614 are displaced in the Y-direction relative to one another. This displacement is directly related to the height of feature 602. A vision processing system (not shown) measures positions of feature 602 in assembled images based upon images 610, 612, and 614 and calculates the height and location of feature 602. Each of images 610, 612, and 614 is preferably used to generate an assembled image. The assembled images are compared such that the difference of the location of feature 602 in the assembled images can be related to the height of feature 602.

Preferably using the assembled images, the vision processing system computes the relative displacement of each feature image in order to calculate its height. It should be appreciated that only two views of the object are necessary to compute the height and location of a feature. The three views can be utilized to lessen the computational burden. For example, some objects or components will only need to have their features located in the X-Y plane. In this case, only the output of the tri-linear detector that views the object at normal incidence is used. It is much faster for the machine vision system to calculate feature locations with the normal incidence view because the location of the features in the image does not depend on their height.

Figure 25:
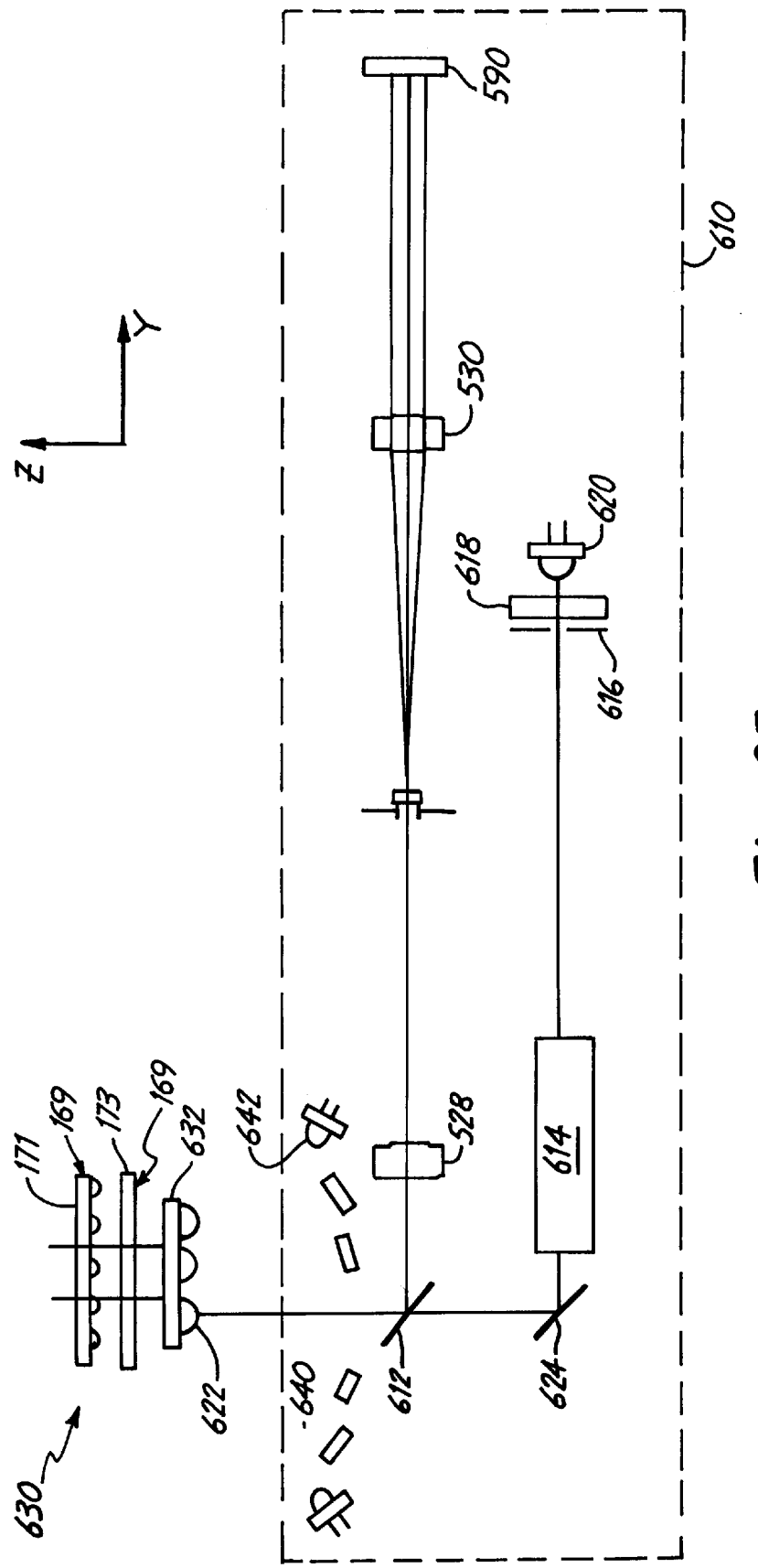
FIG. 25 is a diagrammatic view of a sensor in accordance with an embodiment of the present invention.

The illumination system has been omitted from FIGS. 17 and 24 for clarity. Illumination of the present invention is now illustrated in FIG. 25. The optical system is also folded to make a compact mechanical assembly. Four distinct illumination types are illustrated in FIG. 25. Three of the types, diffuse illuminator 640, darkfield illuminator 642, and backlight illuminator are described herein. Backlight illuminator 169 is coupled to nozzle 82 and includes backlight source 171 and diffuser 173. The brightfield illuminator described previously has been replaced by the optical system shown in FIG. 25 to produce line focus 622, which is essentially light focused into a thin line that extends into and out of the page. To create line focus 622, light from linear LED array 620 illuminates optical slit 616 through diffuser 618. Linear LED array 620 extends into and out of the plane of the page. Optical slit 616 preferably has a dimension of 25 μm in the X-direction. GRIN lens array 614 images optical slit 616 to create illumination line 622. Mirror 624 folds the illumination system and beamsplitter 612 allows the illumination to transmit through. Beamsplitter 612 then re-directs energy reflected from object 632 so that linear detector 590 may generate an image of object 632. Object 632 is supported by vacuum nozzle 630 and linescan sensor 610 is translated in the Z-direction in order to measure the heights and positions of object 632 features.

When using all three views to make a measurement, it is important that the illumination not extend too far in the Y-direction, otherwise the three views will overlap each other on linear detectors 592, 594, and 596. Since the spacing A between the linear detectors 592, 594, and 596 is small for commercially available detector assemblies 590, only the focal line illuminator 622 is used when making height measurements and it is important that the illumination at focal line 622 not extend too far in the Y-direction.

It is possible to time sequence the illuminators in rapid succession during the scan to optimally measure the X, Y locations of features and the heights of features. In the first part of the sequence only feature locations in the X, Y plane are measured. All three illumination types may be turned on simultaneously and only linear detector 594 is read out during this time. In the next part of the sequence, LED array 620 is turned on and all three linear detector arrays are read out in order to measure feature heights. Of course, instead of time sequencing the illuminators, two separate scans can be made in order to get both X, Y feature locations and feature heights. If the line focus illuminator is adequate to make X, Y feature location measurements, all three detectors can be read out to make location and height measurements in the same scan.

Linear LED array 620 is made up of individually addressable LED segments. This may be advantageously used, for example, when object 632 is specularly reflecting. For linear detector 596 which views at angle α, a section of linear LED array 620 is turned on which specularly illuminates object 632 at angle −α. Depending on the object and the features to be located, different sections of linear LED array 620 may be turned on in order to increase the contrast of the features.

It should be understood that, although a telecentric imaging system is shown for some embodiments of the present invention, it is not necessary to use a telecentric imaging system. Telecentric imaging systems have an advantage because the viewing angle does not change across the line being imaged. A conventional imaging system could be compensated for this effect, however. Conventional imaging systems are also, in general, smaller and less complicated than telecentric systems.

Although embodiments of the invention, thus far, have been described with respect to a pick and place machine various embodiments have applicability to other electronic assembly devices such as wire bonders and screen printers.

Figure 26:
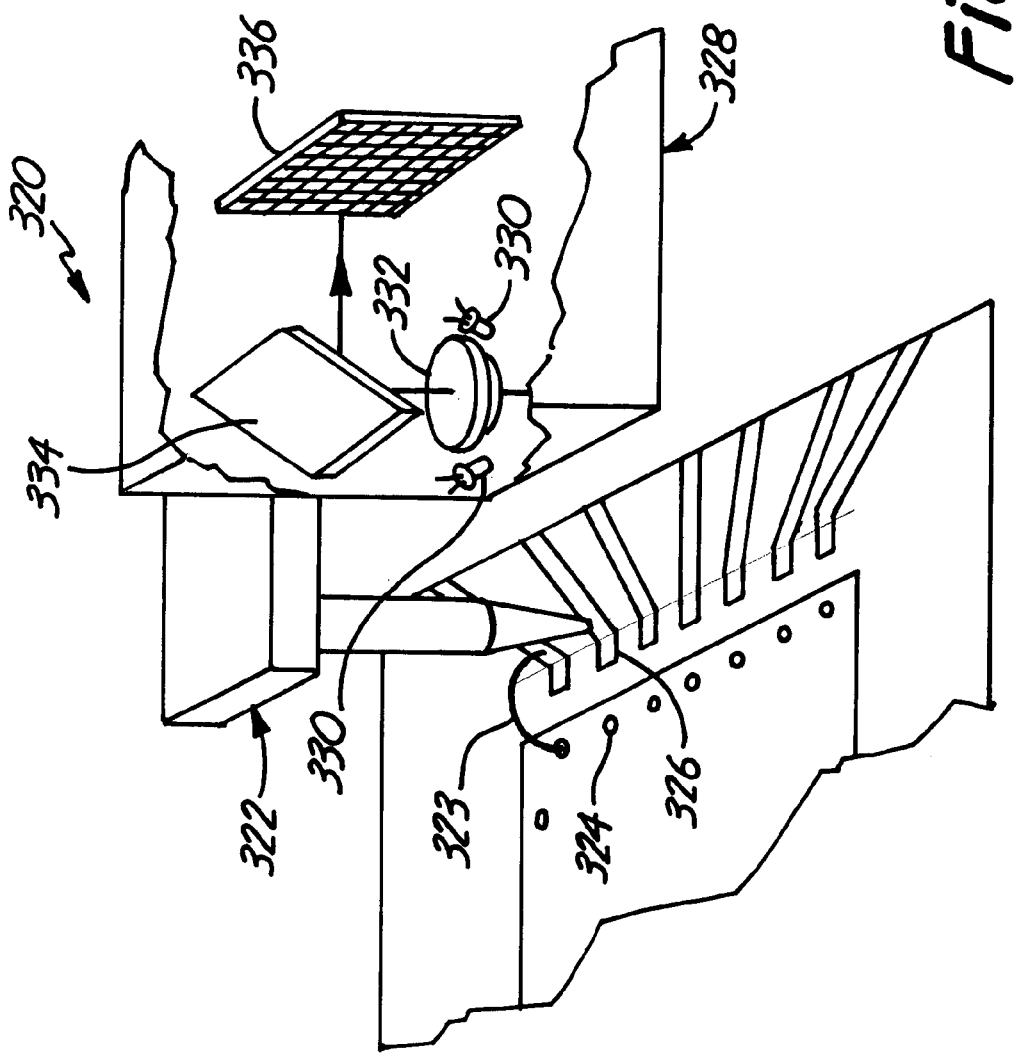
FIG. 26 is a perspective view of a prior art wire bonder.

FIG. 26 is a perspective view of a prior art wire bonder. Bonder 320 includes a bonder head 322 that is adapted to dispense and connect individual wires between die pads 324 and lead pads 326. Bonder 320 uses conventional imaging camera 328 to precisely locate the various pads in order to electrically couple them with wires. Camera 328 includes illuminators 330, lensing system 332, mirror 334 and area detector 336. As is known, illuminators 330 illuminate the pads to be bonded and lens system 332 and mirror 334 cooperate to focus an image of the pads upon area detector 336. Area detector 336 is coupled to additional electronics to process the image to thereby compute die pad and lead pad locations.

FIG. 27 is a top plan view of a wire bonder in accordance with an embodiment of the present invention. Wire bonder 340 includes bonder head 342 and linescan camera 344 in accordance with an embodiment of the present invention. Linescan camera 344 is preferably constructed in accordance with any of the various embodiments described above with respect to pick and place machines, and is able to compute the height of a feature in its field of view. The height of a wire loop 323 can be computed and thresholded with a certain standard, which is helpful in deciding whether to re-work a wire bond or to continue inspecting other wire bonds. The ability to compute height in the present invention can proactively indicate whether a wire bond will short to its packaging in certain applications. Although detector window 346 of line scan detector 344 is disposed at an angle (of approximately 45°) relative to the scan direction X, other embodiments are possible where the detector window is positioned in any location. Orienting the detector window at an angle relative to the scan direction, however, facilitates scanning all four sides of the die.

Although the present invention has been described with reference to preferred embodiments, workers skilled in the art will recognize that changes may be made in form and detail without departing from the spirit and scope of the invention. For example, the present invention is not limited to the embodiments of linescan sensors and associated electronics shown herein and may be practiced with other linescan cameras.

What is claimed is:

1. An optical system for sensing a height of a feature on an object, the system comprising:

a lens system for viewing the feature;

a detector;

a first optical path having a first aperture viewing the feature from a first angle, so as to form a first partial image of the feature on a first section of the detector, the first partial image representative of a portion of the feature;

a second optical path having a second aperture aligned to an optical element so as to view the feature from a second angle and to re-direct light passing through the second aperture and the optical element onto a second section of the detector, thereby forming a second partial image representative of a portion of the feature thereon, the first angle different from the second angle;

a motion control system for providing a relative motion between the detector and the feature;

control electronics for collecting image portions from the detector; and video processing circuitry for assembling the image portions from the first and the second optical paths into a first and a second assembled image, respectively, the circuitry providing the height of the feature as a function of the first and the second assembled images.

2. The system of claim 1 where the lens system has an optical axis, and apertures in the first and the second optical paths are positioned substantially perpendicularly to the optical axis.

3. The system of claim 1 where the apertures in the first and the second optical paths are integrally formed within a single piece of material.

4. The system of claim 1 further comprising a first optical element, the first optical element aligned to the first aperture in the first optical path.

5. The system of claim 1 where optical system is a telecentric optical system.

6. The system of claim 4 where the detector is a linear CCD array.

7. The system of claim 6 where the detector is housed in separate packages, each corresponding to one of the optical paths.

8. The system of claim 4 where the detector comprises a set of three physically distinct linear detectors.

9. The system of claim 8 where the detector is housed in a single package.

10. The system of claim 9 where the single package is a tri-linear array.

11. The system of claim 8, where the control electronics collects image portions from two of the three physically distinct linear detectors.

12. The system of claim 1 where the first partial image is formed on a physically distinct section of the detector from the second partial image.

13. The system of claim 1 where the lens system has an optical axis and neither of the angles in the first and second optical paths are zero with respect to the optical axis, the optical system further comprising a normal optical path comprising an additional aperture aligned to an additional optical element so as to view the feature normally and to re-direct light passing through the additional aperture and the additional optical element onto an additional section of the detector so as to form a normal partial image thereon, where the video processing circuitry collects a plurality of the normal image portions during the relative movement and assembles the plurality into a normal assembled image, where the circuitry provides a location of the feature as a function of the normal assembled image.

14. The system of claim 13 where the detector is housed in separate packages, each corresponding to one of the optical paths.

15. The system of claim 13 where the detector comprises a set of three physically distinct linear detectors.

16. The system of claim 15 where the detector is housed in a single package.

17. The system of claim 16 where the single package is a tri-linear CCD array.

18. The system of claim 1 where the lens system is a single lens.

19. The system of claim 4 where the lens system comprises two lenses sharing a common optical axis, and where the apertures and the optical elements are positioned between the two lenses.

20. The system of claim 13 where the lens system comprises two lenses sharing a common optical axis, and where the apertures and the optical elements are positioned between the two lenses.

21. The system of claim 4 where the aperture and the optical element in each optical path are integrated together in a common package.

22. The system of claim 13 where the aperture and the optical element in each optical path are integrated together in a common package.

23. The system of claim 13 where the first optical element is selected from the group consisting of prisms, gratings, and mirrors.

24. The system of claim 13 where the second optical element is selected from the group consisting of prisms, gratings, and mirrors.

25. The system of claim 13 where the third optical element is selected from the group consisting of prisms, gratings, and mirrors.

26. The system of claim 4 where the video processing circuitry is adapted to selectively provide at least one of a location of the feature and a height of the feature.

27. The system of claim 13 where the video processing circuitry is adapted to selectively provide a location of a feature and a height of a feature.

28. The system of claim 13 where the video processing circuitry further comprises circuitry for computing a reference plane comprised of at least three heights of features on the object, the circuitry providing an output representative of a coplanarity of an additional feature as a function of the reference plane and the height of the additional feature.

29. The system of claim 28 where the optical system further comprises control electronics which indicate a quality of the object as a function of the coplanarity of features on the object.

30. The system of claim 1 where the video processing circuitry further comprises circuitry for computing a reference plane comprised of at least three heights of features on the object, the circuitry providing an output representative of a coplanarity of an additional feature as a function of the reference plane and the height of the additional feature.

31. The system of claim 30 where the optical system further comprises control electronics which indicate a quality of the object as a function of the coplanarity of features on the object.

32. The system of claim 12 further comprising at least one illumination source adapted to illuminate the object, the illumination source selected from the group consisting of darkfield, diffuse and line focus illumination sources, and wherein the at least one illumination source is selectably energized by a set of illumination control electronics.

33. The system of claim 32 where the illumination control electronics selectably control an intensity of the illumination sources.

34. The system of claim 33 where the illumination control electronics individually address elements in the line focus illumination source.

35. The system of claim 1 further comprising illumination sources for illuminating the object, the illumination sources selected from the group of sources called low angle, diffuse and line focus illumination sources, the illumination sources selectably energized by a set of illumination control electronics.

36. The system of claim 35 where the illumination control electronics selectably control an intensity of the illumination sources.

37. The system of claim 36 where the illumination control electronics individually address elements in the line focus illumination source.

38. The system of claim 1 where the first and second apertures are displaced away from each other.

39. The system of claim 1 where the video processing circuitry is adapted to provide at least one image of the object based at least in part upon at least one of the first and second assembled images.

40. The system of claim 1, where the video processing circuitry is adapted to compute a feature displacement.

41. The system of claim 1, where the first and second partial images are interleaved.

42. The system of claim 41, where each of the first and second assembled images is indicative of the portion illuminated with different illumination levels.

43. The system of claim 1, where at least one of the first and second optical paths includes a slit.

44. The system of claim 1, where at least one of the first and second optical paths includes a gradient index lens array.

45. The system of claim 1, where the detector is fixedly mounted.

46. The system of claim 1, where the detector is movable with respect to the component.

47. The system of claim 1, wherein the video circuitry provides the height based at least in part upon reception of encoder signals indicative of detector position.

48. The system of claim 1, wherein the component is of a type selected from the group consisting of ball grid array, micro ball grid array, flip-chip, plastic leaded chip carrier, and quad flat pack.

49. A pick and place machine adapted to place a component, the machine comprising:
- a host processor providing a desired location to place the component;
- a component placement head for releasably holding the component;
- a sensor head for slidably scanning the component, the sensor head comprising:
  - a lens system for viewing the component, the system having an optical axis passing therethrough;
  - a detector;
  - two apertured optical elements positioned substantially in a plane perpendicular to the optical axis, each optical element positioned so as to view the component from a different angle and to re-direct a first and a second image of a portion of the component onto the detector, where the detector and the component are adapted to move relative to each other, so that after the relative movement is finished, a plurality of first images from the detector is representative of a first assembled image of the component and a plurality of second images from the detector is representative of a second assembled image of the component; and
  - video processing circuitry for processing the first and the second assembled images to provide feature height information; and
- wherein the host processor instructs the component placement head based upon the feature height information.

50. The pick and place machine of claim 49 where the sensor head travels in at least one direction with the component placement head.

51. The pick and place machine of claim 49 where the sensor head and the component placement head are not mechanically coupled to one another.

52. The pick and place machine of claim 49 where the component placement head moves the object to a fixed position.

53. A method of picking and placing a component with a pick and place machine, the method comprising:
- providing a desired location to place the component;
- releasably holding the component;
- slidably scanning the component, the scanning comprising:
  - providing a lens system for viewing the component, the system having an optical axis passing therethrough;
  - providing a detector;
  - positioning two apertured optical elements substantially in a plane perpendicular to the optical axis, each optical element positioned so as to view the component from a different angle and to re-direct a first and a second image of a portion of the component onto the detector, where the detector and the component are adapted to move relative to each other, so that after the relative movement is finished, a plurality of first images from the detector is representative of a first assembled image of the component and a plurality of second images from the detector is representative of a second assembled image of the component;
- processing the first and the second assembled images to provide feature height information; and
- placing the component based upon the feature height information.

54. A sensor for sensing a height of a feature on an object, the sensor comprising:
- a lens system for viewing the feature;
- a detector;
- a first optical path having a first aperture viewing the feature from a first angle, so as to form a first partial image of the feature on a first section of the detector, the first partial image representative of a portion of the feature;
- a second optical path having a second aperture aligned to an optical element so as to view the feature from a second angle and to re-direct light passing through the second aperture and the optical element onto a second section of the detector, thereby forming a second partial image representative of a portion of the feature thereon, the first angle different from the second angle;
- control electronics for collecting image portions from the detector; and
- video processing circuitry for assembling the image portions from the first and the second optical paths into a first and a second assembled image, respectively, the circuitry providing at least the height of the feature as a function of the first and the second assembled images.

55. A wire bonder comprising:
- a host processor providing a desired location to attach a wire;
- a head for dispensing and coupling the wire;
- a sensor head for slidably scanning at least a portion of one of the wire, a die pad, and a lead frame, the sensor head comprising:
  - a lens system for viewing the portion, the system having an optical axis passing therethrough;
  - a detector;
  - two apertured optical elements positioned substantially in a plane perpendicular to the optical axis, each optical element positioned so as to view the portion from a different angle and to re-direct a first and a second image of the portion onto the detector, wherein the detector and the portion are adapted to move relative to each other, so that after the relative movement is finished, a plurality of first images from the detector is representative of a first assembled image of the portion and a plurality of second images from the detector is representative of a second assembled image of the portion; and
  - video processing circuitry for processing the first and the second assembled images to provide feature height information; and wherein the host processor instructs the wire bonder head based upon the feature height information.

56. A screen printer comprising:

a host processor adapted to provide an output related to a characteristic of at least one of a stencil and a circuit board;

a head adapted to dispense solder paste upon the circuit board;

a sensor head for slidably scanning at least a portion of one of the circuit board and the stencil, the sensor head comprising:
  a lens system for viewing the portion, the system having an optical axis passing therethrough;
  a detector;
  two apertured optical elements positioned substantially in a plane perpendicular to the optical axis, each optical element positioned so as to view the portion from a different angle and to re-direct a first and a second image of the portion onto the detector, wherein the detector and the portion are adapted to move relative to each other, so that after the relative movement is finished, a plurality of first images from the detector is representative of a first assembled image of the portion and a plurality of second images from the detector is representative of a second assembled image of the portion;

video processing circuitry for processing the first and the second assembled images to provide feature height information; and wherein the host processor provides the output based at least in part upon the feature height information.

* * * * *

UNITED STATES PATENT AND TRADEMARK OFFICE
CERTIFICATE OF CORRECTION

PATENT NO. : 6,610,991 B1
DATED : August 26, 2003
INVENTOR(S) : Case

It is certified that error appears in the above-identified patent and that said Letters Patent is hereby corrected as shown below:

<u>Title page,</u>
Item [73], Assignee, "CyberOptics Corporation, Eden Prairie, MN" should be
-- CyberOptics Corporation, Eden Praire, MN, Golden Valley, MN --

Signed and Sealed this

Twenty-fifth Day of May, 2004

JON W. DUDAS
*Acting Director of the United States Patent and Trademark Office*